United States Patent
Chung et al.

(10) Patent No.: US 7,892,602 B2
(45) Date of Patent: *Feb. 22, 2011

(54) CYCLICAL DEPOSITION OF REFRACTORY METAL SILICON NITRIDE

(75) Inventors: Hua Chung, San Jose, CA (US); Ling Chen, Sunnyvale, CA (US); Barry L. Chin, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 1237 days.

This patent is subject to a terminal disclaimer.

(21) Appl. No.: 11/422,826

(22) Filed: Jun. 7, 2006

(65) Prior Publication Data

US 2006/0216928 A1 Sep. 28, 2006

Related U.S. Application Data

(63) Continuation of application No. 10/199,419, filed on Jul. 18, 2002, now Pat. No. 7,081,271.

(60) Provisional application No. 60/337,646, filed on Dec. 7, 2001.

(51) Int. Cl.
*C23C 16/34* (2006.01)
(52) U.S. Cl. .......... 427/255.391; 427/255.393; 427/255.394; 427/579
(58) Field of Classification Search .......... 427/255.391, 427/255.393, 255.394, 579; *C23C 16/34*
See application file for complete search history.

(56) References Cited

U.S. PATENT DOCUMENTS

| 4,389,973 A | 6/1983 | Suntola et al. |
| 4,413,022 A | 11/1983 | Suntola et al. |

(Continued)

FOREIGN PATENT DOCUMENTS

| EP | 1167569 | 1/2002 |

(Continued)

OTHER PUBLICATIONS

Min, Jae-Sik, et al., "Metal-organic atomic layer deposition ot titanium silicon nitride films." Applied Physics Letters, vol. 75, No. 11, Sep. 13, 1999, pp. 1521-1523.*

(Continued)

*Primary Examiner*—Bret Chen
(74) *Attorney, Agent, or Firm*—Patterson & Sheridan, LLP

(57) ABSTRACT

Methods for depositing a metal silicon nitride layer on a substrate during an atomic layer deposition (ALD) process. The methods provide positioning a substrate within a process chamber containing a centralized expanding channel that conically tapers towards and substantially covers the substrate, flowing a process gas into the centralized expanding channel to form a circular flow pattern, exposing the substrate to the process gas having the circular flow pattern, and exposing the substrate sequentially to chemical precursors during an ALD process to form a metal silicon nitride material. In one example, the ALD process provides sequentially pulsing a metal precursor, a nitrogen precursor, and a silicon precursor into the process gas having the circular flow pattern. The metal silicon nitride material may contain tantalum or titanium. In other examples, the process gas or the substrate may be exposed to a plasma.

41 Claims, 12 Drawing Sheets

U.S. PATENT DOCUMENTS

| | | |
|---|---|---|
| 4,486,487 A | 12/1984 | Skarp et al. |
| 5,015,917 A | 5/1991 | Nigg |
| 5,306,666 A | 4/1994 | Izumi et al. |
| 5,374,570 A | 12/1994 | Nasu et al. |
| 5,503,875 A | 4/1996 | Imai et al. |
| 5,526,244 A | 6/1996 | Bishop |
| 5,711,811 A | 1/1998 | Suntola et al. |
| 5,834,372 A | 11/1998 | Lee et al. |
| 5,916,365 A | 6/1999 | Sherman |
| 5,923,056 A | 7/1999 | Lee et al. |
| 5,989,345 A | 11/1999 | Hatano et al. |
| 6,001,420 A | 12/1999 | Mosely et al. |
| 6,015,590 A | 1/2000 | Suntola et al. |
| 6,015,917 A | 1/2000 | Bhandari et al. |
| 6,084,302 A | 7/2000 | Sandhu |
| 6,124,158 A | 9/2000 | Dautartas et al. |
| 6,139,700 A | 10/2000 | Kang et al. |
| 6,143,077 A | 11/2000 | Ikeda et al. |
| 6,144,060 A | 11/2000 | Park et al. |
| 6,174,809 B1 | 1/2001 | Kang et al. |
| 6,197,683 B1 | 3/2001 | Kang et al. |
| 6,200,893 B1 | 3/2001 | Sneh |
| 6,203,613 B1 | 3/2001 | Gates et al. |
| 6,207,302 B1 | 3/2001 | Sugiura et al. |
| 6,207,487 B1 | 3/2001 | Kim et al. |
| 6,270,572 B1 | 8/2001 | Kim et al. |
| 6,284,646 B1 | 9/2001 | Leem et al. |
| 6,287,965 B1 | 9/2001 | Kang et al. |
| 6,294,836 B1 | 9/2001 | Paranjpe et al. |
| 6,305,314 B1 | 10/2001 | Sneh et al. |
| 6,306,216 B1 | 10/2001 | Kim et al. |
| 6,342,277 B1 | 1/2002 | Sherman |
| 6,348,376 B2 | 2/2002 | Lim et al. |
| 6,358,829 B2 | 3/2002 | Yoon et al. |
| 6,365,502 B1 | 4/2002 | Paranjpe et al. |
| 6,372,598 B2 | 4/2002 | Kang et al. |
| 6,379,748 B1 | 4/2002 | Bhandari et al. |
| 6,391,785 B1 | 5/2002 | Satta et al. |
| 6,391,803 B1 | 5/2002 | Kim et al. |
| 6,399,491 B2 | 6/2002 | Jeon et al. |
| 6,416,577 B1 | 7/2002 | Suntoloa et al. |
| 6,416,822 B1 | 7/2002 | Chiang et al. |
| 6,428,859 B1 | 8/2002 | Chiang et al. |
| 6,440,202 B1 | 8/2002 | Xu et al. |
| 6,444,263 B1 | 9/2002 | Paranjpe et al. |
| 6,451,119 B2 | 9/2002 | Sneh et al. |
| 6,451,695 B2 | 9/2002 | Sneh |
| 6,458,701 B1 | 10/2002 | Chae et al. |
| 6,468,924 B2 | 10/2002 | Lee et al. |
| 6,475,276 B1 | 11/2002 | Elers et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,498,091 B1 | 12/2002 | Chen et al. |
| 6,511,539 B1 | 1/2003 | Raaijmakers |
| 6,515,368 B1 | 2/2003 | Lopatin et al. |
| 6,524,952 B1 | 2/2003 | Srinivas et al. |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,585,823 B1 | 7/2003 | Van Wijck |
| 6,593,484 B2 | 7/2003 | Yasuhara et al. |
| 6,596,602 B2 | 7/2003 | Iizuka et al. |
| 6,596,643 B2 | 7/2003 | Chen et al. |
| 6,599,572 B2 | 7/2003 | Saanila et al. |
| 6,607,976 B2 | 8/2003 | Chen et al. |
| 6,620,723 B1 | 9/2003 | Byun et al. |
| 6,627,995 B2 | 9/2003 | Paranipe et al. |
| 6,630,201 B2 | 10/2003 | Chiang et al. |
| 6,632,279 B1 | 10/2003 | Ritala et al. |
| 6,645,847 B2 | 11/2003 | Paranjpe et al. |
| 6,660,622 B2 | 12/2003 | Chen et al. |
| 6,686,271 B2 | 2/2004 | Raaijmakers et al. |
| 6,718,126 B2 | 4/2004 | Lei |
| 6,720,027 B2 | 4/2004 | Yang et al. |
| 6,740,585 B2 | 5/2004 | Yoon et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,784,096 B2 | 8/2004 | Chen et al. |
| 6,790,773 B1 | 9/2004 | Drewery et al. |
| 6,794,284 B2 | 9/2004 | Vaartstra |
| 6,797,108 B2 | 9/2004 | Wendling |
| 6,800,173 B2 | 10/2004 | Chiang et al. |
| 6,803,272 B1 | 10/2004 | Halliyal et al. |
| 6,812,126 B1 | 11/2004 | Paranipe et al. |
| 6,815,285 B2 | 11/2004 | Choi et al. |
| 6,821,563 B2 | 11/2004 | Yudovsky |
| 6,831,004 B2 | 12/2004 | Byun et al. |
| 6,838,125 B2 | 1/2005 | Chung et al. |
| 6,846,516 B2 | 1/2005 | Yang et al. |
| 6,849,545 B2 | 2/2005 | Mak et al. |
| 6,861,356 B2 | 3/2005 | Matsuse et al. |
| 6,866,746 B2 | 3/2005 | Lei et al. |
| 6,875,271 B2 | 4/2005 | Glenn et al. |
| 6,893,915 B2 | 5/2005 | Park et al. |
| 6,905,541 B2 | 6/2005 | Chen et al. |
| 6,905,737 B2 | 6/2005 | Verplancken et al. |
| 6,911,391 B2 | 6/2005 | Yang et al. |
| 6,915,592 B2 | 7/2005 | Guenther |
| 6,916,398 B2 | 7/2005 | Chen et al. |
| 6,936,906 B2 | 8/2005 | Chung et al. |
| 6,939,801 B2 | 9/2005 | Chung et al. |
| 6,951,804 B2 | 10/2005 | Seutter et al. |
| 6,953,742 B2 | 10/2005 | Chen et al. |
| 6,955,211 B2 | 10/2005 | Ku et al. |
| 6,958,296 B2 | 10/2005 | Chen et al. |
| 6,972,267 B2 | 12/2005 | Cao et al. |
| 6,974,771 B2 | 12/2005 | Chen et al. |
| 6,998,014 B2 | 2/2006 | Chen et al. |
| 7,005,697 B2 | 2/2006 | Batra et al. |
| 7,026,238 B2 | 4/2006 | Xi et al. |
| 7,041,335 B2 * | 5/2006 | Chung ................ 427/255.394 |
| 7,049,226 B2 | 5/2006 | Chung et al. |
| 7,066,194 B2 | 6/2006 | Ku et al. |
| 7,067,422 B2 | 6/2006 | Nakamura et al. |
| 7,081,271 B2 * | 7/2006 | Chung et al. ......... 427/255.391 |
| 7,081,409 B2 | 7/2006 | Kang et al. |
| 7,094,680 B2 | 8/2006 | Seutter et al. |
| 7,094,685 B2 | 8/2006 | Yang et al. |
| 7,098,131 B2 | 8/2006 | Kang et al. |
| 7,175,713 B2 | 2/2007 | Thakur et al. |
| 7,186,385 B2 | 3/2007 | Ganguli et al. |
| 7,204,886 B2 | 4/2007 | Chen et al. |
| 7,208,413 B2 | 4/2007 | Byun et al. |
| 7,211,508 B2 | 5/2007 | Chung et al. |
| 7,228,873 B2 | 6/2007 | Ku et al. |
| 7,241,686 B2 * | 7/2007 | Marcadal et al. ............ 438/656 |
| 7,402,210 B2 | 7/2008 | Chen et al. |
| 7,408,225 B2 | 8/2008 | Shinriki et al. |
| 7,524,762 B2 * | 4/2009 | Marcadal et al. ............ 438/656 |
| 2001/0000866 A1 | 5/2001 | Sneh et al. |
| 2001/0002280 A1 | 5/2001 | Sneh |
| 2001/0009140 A1 | 7/2001 | Bondestam et al. |
| 2001/0009695 A1 | 7/2001 | Saanila et al. |
| 2001/0024387 A1 | 9/2001 | Raaijmakers et al. |
| 2001/0025979 A1 | 10/2001 | Kim et al. |
| 2001/0028924 A1 | 10/2001 | Sherman |
| 2001/0034123 A1 | 10/2001 | Jeon et al. |
| 2001/0041250 A1 | 11/2001 | Werkhoven et al. |
| 2001/0050039 A1 | 12/2001 | Park |
| 2001/0054730 A1 | 12/2001 | Kim et al. |

| | | |
|---|---|---|
| 2001/0054769 A1 | 12/2001 | Raaijmakers et al. |
| 2002/0000598 A1 | 1/2002 | Kang et al. |
| 2002/0007790 A1 | 1/2002 | Park |
| 2002/0009544 A1 | 1/2002 | McFeely et al. |
| 2002/0016084 A1 | 2/2002 | Todd |
| 2002/0020869 A1 | 2/2002 | Park et al. |
| 2002/0021544 A1 | 2/2002 | Cho et al. |
| 2002/0031618 A1 | 3/2002 | Sherman |
| 2002/0041931 A1 | 4/2002 | Suntola et al. |
| 2002/0047151 A1 | 4/2002 | Kim et al. |
| 2002/0048635 A1 | 4/2002 | Kim et al. |
| 2002/0052097 A1 | 5/2002 | Park |
| 2002/0060363 A1 | 5/2002 | Xi et al. |
| 2002/0068458 A1 | 6/2002 | Chiang et al. |
| 2002/0073924 A1 | 6/2002 | Chiang et al. |
| 2002/0074588 A1 | 6/2002 | Lee |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0076837 A1 | 6/2002 | Hujanen et al. |
| 2002/0081844 A1 | 6/2002 | Jeon et al. |
| 2002/0086111 A1 | 7/2002 | Byun et al. |
| 2002/0086507 A1 | 7/2002 | Park et al. |
| 2002/0094689 A1 | 7/2002 | Park |
| 2002/0098627 A1 | 7/2002 | Pomarede et al. |
| 2002/0104481 A1 | 8/2002 | Chiang et al. |
| 2002/0106536 A1 | 8/2002 | Lee et al. |
| 2002/0106846 A1 | 8/2002 | Seutter et al. |
| 2002/0115886 A1 | 8/2002 | Yasuhara et al. |
| 2002/0117399 A1 | 8/2002 | Chen et al. |
| 2002/0135071 A1 | 9/2002 | Kang et al. |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0155722 A1 | 10/2002 | Satta et al. |
| 2002/0162506 A1 | 11/2002 | Sneh et al. |
| 2002/0164421 A1 | 11/2002 | Chiang et al. |
| 2002/0164423 A1 | 11/2002 | Chiang et al. |
| 2002/0177282 A1 | 11/2002 | Song |
| 2002/0182320 A1 | 12/2002 | Leskela et al. |
| 2002/0187256 A1 | 12/2002 | Elers et al. |
| 2002/0187631 A1 | 12/2002 | Kim et al. |
| 2002/0192396 A1 | 12/2002 | Wang et al. |
| 2002/0197402 A1 | 12/2002 | Chiang et al. |
| 2002/0197856 A1 | 12/2002 | Matsuse et al. |
| 2002/0197863 A1 | 12/2002 | Mak et al. |
| 2003/0013300 A1 | 1/2003 | Byun |
| 2003/0013320 A1 | 1/2003 | Kim et al. |
| 2003/0017697 A1 | 1/2003 | Choi et al. |
| 2003/0022487 A1 | 1/2003 | Yoon et al. |
| 2003/0022507 A1 | 1/2003 | Chen et al. |
| 2003/0029715 A1 | 2/2003 | Yu et al. |
| 2003/0031807 A1 | 2/2003 | Elers et al. |
| 2003/0032281 A1 | 2/2003 | Werkhoven et al. |
| 2003/0038369 A1 | 2/2003 | Layadi et al. |
| 2003/0042630 A1 | 3/2003 | Babcoke et al. |
| 2003/0049931 A1 | 3/2003 | Byun et al. |
| 2003/0049942 A1 | 3/2003 | Haukka et al. |
| 2003/0053799 A1 | 3/2003 | Lei |
| 2003/0054631 A1 | 3/2003 | Raaijmakers et al. |
| 2003/0057526 A1 | 3/2003 | Chung et al. |
| 2003/0057527 A1 | 3/2003 | Chung et al. |
| 2003/0059538 A1 | 3/2003 | Chung et al. |
| 2003/0072884 A1 | 4/2003 | Zhang et al. |
| 2003/0072975 A1 | 4/2003 | Shero et al. |
| 2003/0079686 A1* | 5/2003 | Chen et al. ............ 118/715 |
| 2003/0082296 A1 | 5/2003 | Elers et al. |
| 2003/0082300 A1 | 5/2003 | Todd et al. |
| 2003/0082301 A1 | 5/2003 | Chen et al. |
| 2003/0082307 A1 | 5/2003 | Chung et al. |
| 2003/0087520 A1 | 5/2003 | Chen et al. |
| 2003/0089308 A1 | 5/2003 | Raaijmakers |
| 2003/0101927 A1 | 6/2003 | Raaijmakers |
| 2003/0106490 A1 | 6/2003 | Jallepally et al. |
| 2003/0108674 A1 | 6/2003 | Chung et al. |
| 2003/0113187 A1 | 6/2003 | Lei et al. |
| 2003/0116087 A1 | 6/2003 | Nguyen et al. |
| 2003/0121608 A1* | 7/2003 | Chen et al. ............ 156/345.33 |
| 2003/0124262 A1 | 7/2003 | Chen et al. |
| 2003/0129826 A1 | 7/2003 | Werkhoven et al. |
| 2003/0134508 A1 | 7/2003 | Raaijmakers et al. |
| 2003/0143328 A1 | 7/2003 | Chen et al. |
| 2003/0143839 A1 | 7/2003 | Raaijmakers et al. |
| 2003/0143841 A1 | 7/2003 | Yang et al. |
| 2003/0153177 A1 | 8/2003 | Tepman et al. |
| 2003/0165615 A1 | 9/2003 | Aaltonen et al. |
| 2003/0168750 A1 | 9/2003 | Basceri et al. |
| 2003/0173586 A1 | 9/2003 | Moriwaki et al. |
| 2003/0186495 A1 | 10/2003 | Saanila et al. |
| 2003/0190423 A1 | 10/2003 | Yang et al. |
| 2003/0190497 A1 | 10/2003 | Yang et al. |
| 2003/0190804 A1 | 10/2003 | Glenn et al. |
| 2003/0205729 A1 | 11/2003 | Basceri et al. |
| 2003/0207564 A1 | 11/2003 | Ahn et al. |
| 2003/0213987 A1 | 11/2003 | Basceri et al. |
| 2003/0219942 A1 | 11/2003 | Choi et al. |
| 2003/0224578 A1 | 12/2003 | Chung et al. |
| 2003/0224600 A1 | 12/2003 | Cao et al. |
| 2003/0232497 A1 | 12/2003 | Xi et al. |
| 2004/0005749 A1 | 1/2004 | Choi et al. |
| 2004/0009307 A1 | 1/2004 | Koh et al. |
| 2004/0009336 A1 | 1/2004 | Marcadal et al. |
| 2004/0011504 A1 | 1/2004 | Ku et al. |
| 2004/0013577 A1 | 1/2004 | Ganguli et al. |
| 2004/0013803 A1 | 1/2004 | Chung et al. |
| 2004/0014320 A1 | 1/2004 | Chen et al. |
| 2004/0015300 A1 | 1/2004 | Ganguli et al. |
| 2004/0018304 A1 | 1/2004 | Chung et al. |
| 2004/0018723 A1 | 1/2004 | Byun et al. |
| 2004/0018747 A1 | 1/2004 | Lee et al. |
| 2004/0025370 A1 | 2/2004 | Guenther |
| 2004/0033698 A1 | 2/2004 | Lee et al. |
| 2004/0043630 A1 | 3/2004 | Vaartstra et al. |
| 2004/0046197 A1 | 3/2004 | Basceri et al. |
| 2004/0048461 A1 | 3/2004 | Chen et al. |
| 2004/0065255 A1 | 4/2004 | Yang et al. |
| 2004/0067641 A1 | 4/2004 | Yudovsky |
| 2004/0071897 A1 | 4/2004 | Verplancken et al. |
| 2004/0077183 A1 | 4/2004 | Chung |
| 2004/0105934 A1 | 6/2004 | Chang et al. |
| 2004/0144311 A1 | 7/2004 | Chen et al. |
| 2004/0170403 A1 | 9/2004 | Lei |
| 2004/0187304 A1 | 9/2004 | Chen et al. |
| 2004/0197492 A1 | 10/2004 | Chen et al. |
| 2004/0209460 A1 | 10/2004 | Xi et al. |
| 2004/0211665 A1 | 10/2004 | Yoon et al. |
| 2004/0214354 A1 | 10/2004 | Marsh et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2004/0241321 A1 | 12/2004 | Ganguli et al. |
| 2004/0256351 A1 | 12/2004 | Chung et al. |
| 2004/0266175 A1 | 12/2004 | Chen et al. |
| 2005/0006799 A1 | 1/2005 | Gregg et al. |
| 2005/0008779 A1 | 1/2005 | Yang et al. |
| 2005/0009325 A1 | 1/2005 | Chung et al. |
| 2005/0059240 A1 | 3/2005 | Choi et al. |
| 2005/0074968 A1 | 4/2005 | Chen et al. |
| 2005/0104142 A1 | 5/2005 | Narayanan et al. |
| 2005/0106865 A1* | 5/2005 | Chung et al. ............ 438/685 |
| 2005/0118804 A1 | 6/2005 | Byun et al. |
| 2005/0139160 A1 | 6/2005 | Lei et al. |
| 2005/0139948 A1 | 6/2005 | Chung et al. |
| 2005/0164487 A1 | 7/2005 | Seutter et al. |
| 2005/0173068 A1 | 8/2005 | Chen et al. |
| 2005/0189072 A1 | 9/2005 | Chen et al. |

| | | | |
|---|---|---|---|
| 2005/0208217 A1 | 9/2005 | Shinriki et al. | |
| 2005/0220998 A1 | 10/2005 | Chang et al. | |
| 2005/0252449 A1 | 11/2005 | Nguyen et al. | |
| 2005/0255690 A1 | 11/2005 | Chen et al. | |
| 2005/0257735 A1 | 11/2005 | Guenther | |
| 2005/0260357 A1 | 11/2005 | Olsen et al. | |
| 2005/0266682 A1 | 12/2005 | Chen et al. | |
| 2005/0271812 A1 | 12/2005 | Myo et al. | |
| 2005/0271813 A1 | 12/2005 | Kher et al. | |
| 2005/0277290 A1 | 12/2005 | Yang et al. | |
| 2006/0019033 A1 | 1/2006 | Muthukrishnan et al. | |
| 2006/0019494 A1 | 1/2006 | Cao et al. | |
| 2006/0019495 A1 | 1/2006 | Marcadal et al. | |
| 2006/0030148 A1 | 2/2006 | Seutter et al. | |
| 2006/0035025 A1 | 2/2006 | Verplancken et al. | |
| 2006/0057843 A1 | 3/2006 | Chen et al. | |
| 2006/0062917 A1 | 3/2006 | Muthukrishnan et al. | |
| 2006/0075966 A1 | 4/2006 | Chen et al. | |
| 2006/0128150 A1 | 6/2006 | Gandikota et al. | |
| 2006/0148253 A1 | 7/2006 | Chung et al. | |
| 2006/0153973 A1 | 7/2006 | Chang et al. | |
| 2006/0153995 A1 | 7/2006 | Narwankar et al. | |
| 2006/0156979 A1 | 7/2006 | Thakur et al. | |
| 2006/0199372 A1 | 9/2006 | Chung et al. | |
| 2006/0216928 A1 | 9/2006 | Chung et al. | |
| 2006/0257295 A1 | 11/2006 | Chen et al. | |
| 2006/0276020 A1 | 12/2006 | Yoon et al. | |
| 2006/0292864 A1 | 12/2006 | Yang et al. | |
| 2007/0003698 A1 | 1/2007 | Chen et al. | |
| 2007/0018244 A1 | 1/2007 | Hung et al. | |
| 2007/0020890 A1 | 1/2007 | Thakur et al. | |
| 2007/0026147 A1 | 2/2007 | Chen et al. | |
| 2007/0059948 A1 | 3/2007 | Metzner et al. | |
| 2007/0067609 A1 | 3/2007 | Chen et al. | |
| 2007/0095285 A1 | 5/2007 | Thakur et al. | |
| 2007/0099415 A1 | 5/2007 | Chen et al. | |
| 2007/0119370 A1 | 5/2007 | Ma et al. | |
| 2007/0119371 A1 | 5/2007 | Ma et al. | |
| 2007/0128862 A1 | 6/2007 | Ma et al. | |
| 2007/0128863 A1 | 6/2007 | Ma et al. | |
| 2007/0128864 A1 | 6/2007 | Ma et al. | |
| 2008/0038463 A1 | 2/2008 | Chen et al. | |
| 2008/0041307 A1 | 2/2008 | Nguyen et al. | |
| 2008/0041313 A1 | 2/2008 | Chen et al. | |
| 2008/0044569 A1 | 2/2008 | Myo et al. | |
| 2008/0102203 A1 | 5/2008 | Wu et al. | |
| 2008/0102208 A1 | 5/2008 | Wu et al. | |
| 2008/0107809 A1 | 5/2008 | Wu et al. | |
| 2008/0268171 A1 | 10/2008 | Ma et al. | |
| 2008/0274299 A1 | 11/2008 | Chen et al. | |

FOREIGN PATENT DOCUMENTS

| | | |
|---|---|---|
| GB | 2355727 | 5/2001 |
| JP | 1143221 | 6/1989 |
| JP | 02246161 | 10/1990 |
| JP | 07300649 | 11/1995 |
| JP | 10308283 | 11/1998 |
| JP | 2000031387 | 1/2000 |
| JP | 2000-058639 A | 2/2000 |
| JP | 2000-058650 A | 2/2000 |
| JP | 2000058777 | 2/2000 |
| JP | 2001111000 | 4/2001 |
| JP | 2001172767 | 6/2001 |
| JP | 2001-217206 A | 8/2001 |
| JP | 2001220294 | 8/2001 |
| JP | 2001254181 | 9/2001 |
| WO | WO-9617107 | 6/1996 |
| WO | WO-9901595 | 1/1999 |
| WO | WO-9929924 | 6/1999 |
| WO | WO-9965064 | 12/1999 |
| WO | WO-0015865 | 3/2000 |
| WO | WO-0016377 | 3/2000 |
| WO | WO-0020024 | 4/2000 |
| WO | WO-0054320 | 9/2000 |
| WO | WO-0063957 | 10/2000 |
| WO | WO-0079576 | 12/2000 |
| WO | WO-0115220 | 3/2001 |
| WO | WO-0117692 | 3/2001 |
| WO | WO-0127346 | 4/2001 |
| WO | WO-0127347 | 4/2001 |
| WO | WO-0129280 | 4/2001 |
| WO | WO-0129891 | 4/2001 |
| WO | WO-0129893 | 4/2001 |
| WO | WO-0136702 | 5/2001 |
| WO | WO-0166832 | 9/2001 |
| WO | WO-0201628 | 1/2002 |
| WO | WO-0208485 | 1/2002 |
| WO | WO-0243115 | 5/2002 |
| WO | WO-0245167 | 6/2002 |
| WO | WO-0245871 | 6/2002 |
| WO | WO-0246489 | 6/2002 |
| WO | WO-02067319 | 8/2002 |
| WO | WO-2004106584 | 12/2004 |

OTHER PUBLICATIONS

Park, Jin-Seong, et al., "Plasma Enhanced CVD of Titanium Silicon Nitride Using TiCl4, SiH4, and N2/H2/Ar Plasma". Electrochemical and Solid State Letters, 7 (8), C87-C89 (2004).*

Park, Hokyung, et al., "Device Performance and Reliability Characteristics of Tantalum Silicon Nitride . . . ". Japanese Journal of Applied Physics 48 (2009), 116506-1 to 116506-3.*

Cameron, et al. "Atomic Layer Deposition of $SiO_2$ and $TiO_2$ in Alumina Tubular Membranes," Langmuir, vol. 16, No. 19, American Chemical Society, 2000, pp. 7435-7444.

Clark-Phelps, et al. "Engineered Tantalum Aluminate and Hafnium Aluminate ALD Films for Ultrathin Dielectric Films with Improved Electrical and Thermal Properties" Mat. Res. Soc. Symp. Proc. vol. 670 (2001).

Eisenbraun, et al. "Atomic Layer Deposition (ALD) of Tantalum-based materials for zero thickness copper barrier applications" Proceedings of the IEEE 2001 International Interconnect Technology Conference (Cat. No. 01EX461) 2001.

George, et al. "Surface Chemistry for Atomic Layer Growth," J. Phys. Chem. 1996, 100, pp. 13121-13131.

Goswami, et al. Transition Metals Show Promise as Copper Barriers, Semiconductor International, ATMI, San Jose—May 1, 2004.

Hiramatsu, et al. "Formation of TiN films with low Cl concentration by pulsed plasma chemical vapor deposition," J. Vac. Sci. Technolo. A, vol. 14, No. 3, (May/Jun. 1996).

Hong, et al. "Characteristics of PAALD-TaN thin films derived from TAIMATA precursor for copper metallization", Internconnect Technology Conference, 2004. Proceedings of the IEEE 2004 International, Jun. 7-9, 2004, pp. 9-11.

Hwang, et al. "Nanometer-Size $\alpha$-$PbO_2$-type $TiO_2$ in Garnet: A Thermobarometer for Ultrahigh-Pressure Metamorphism," Science, vol. 288, (Apr. 14, 2000).

Klaus, et al. "Atomic Layer Deposition of $SiO_2$ Using Catalyzed and Uncatalyzed Self-Limiting Surface Reactions," Surface Review and Letters, vol. 6, Nos. 3 & 4 (1999), pp. 435-448.

Kukli et al. "Atomic Layer Epitaxy Growth of Tantalum Oxide Thin Films from $Ta(OC_2H_5)_5$ and $H_2O$" Journal of the Electrochemical Society vol. 142 No. 5 May 1995; p. 1670-5.

Kukli et al. "In situ Study of Atomic Layer Epitaxy Growth of Tantalum Oxide Thin Films From $Ta(OC_2H_5)_5$ and $H_2O$" Applied Surface Science vol. 112 Mar. 1997 p. 236-42.

Kukli, et al. "Properties of $\{Nb_{1-x}Ta_x\}_2O_5$ Solid Solutions and $\{Nb_{1-x}Ta_x\}_2O_5$-$ZrO_2$ Nanolaminates Grown by Atomic Layer Epitaxy." 1997; p. 785-93.

Kukli et al. "Properties of $Ta_2O_5$-Based Dielectric Nanolaminates Deposited by Atomic Layer Epitaxy" Journal of the Electrochemical Society vol. 144 No. 1 Jan. 1997; p. 300-6.

Kukli et al. "Tailoring the Dielectric Properties of $HfO_2$-$Ta_2$-$O_5$ Nanolaminates" Applied Physics Letters vol. 68 No. 26 Jun. 24, 1996; p. 3737-9.

Martensson, et al. "Use of Atomic Layer Epitaxy for Fabrication of Si/TiN/Cu Structures," J. Vac. Sci. & Tech. B, vol. 17, No. 5, (Sep. 1999), pp. 2122-2128.

Min, et al. "Atomic Layer Deposition of TiN Thin Films by Sequential Introduction of Ti Precursor and $NH_3$," Mat. Res. Soc. Symp. Proc., vol. 514 (1998).

Min, et al. "Chemical Vapor Deposition of Ti-Si-N Films With Alternating Source Supply," Mat. Rec. Soc. Symp. Proc. (1999).

Min, et al. "Metal-organic Atomic-layer Deposition of Titanium-silicon-nitride films," Applied Physics Letters, vol. 75, No. 11 (Sep. 13, 1999).

Niinisto, et al. "Synthesis of Oxide Thin Films and Overlayers by Atomic Layer Epitaxy for Advanced Applications," Materials Science and Engineering B41 (1996), pp. 23-29.

Park, et al. "Performance improvement of MOSFET with $HfO_2\_Al_2O_3$ laminate gate dielectric and CVD-TaN metal gate deposited by TAIMATA", Electron Devices Meeting, 2003. IEDM '03 Techinical Digest. IEEE International Dec. 8-10, 2003, pp. 13.6.1-13.6.4.

Proceedings of the ICEEE 1998 International Interconnect Technology Conference—San Francisco, California, Jun. 1-3, 1998.

Ritala, et al. "Atomic Force Microscopy Study of Titanium Dioxide Thin Films Grown by Atomic Layer Epitaxy," Thin Solid Films, vol. 228, No. 1-2 (May 15, 1993), pp. 32-35.

Ritala, et al. "Atomic Layer Epitaxy Growth of TiN Thin Films From $TiI_4$ and $NH_3$," J. Electrochem. Soc., vol. 145, No. 8 (Aug. 1998), pp. 2914-2920.

Ritala, et al. "Atomic Layer Epitaxy Growth of TiN Thin Films," J. Electrochem. Soc., vol. 142, No. 8, Aug. 1995.

Ritala, et al. "Effects of Intermediate Zinc Pulses on Properties of TiN and NbN Films by Atomic Layer Epitaxy," Applied Surface Science, vol. 120, No. 3-4, (Dec. 1997), pp. 199-212.

Ritala, et al. "Growth of Titanium Dioxide Thin Films by Atomic Layer Epitaxy," Thin Solid Films, vol. 225, No. 1-2 (Mar. 25, 1993) pp. 288-295.

Ritala, et al. "Perfectly Conformal TiN and $Al_2O_3$ Films Deposited by Atomic Layer Deposition," Chemical Vapor Deposition, Jan. 1999, 5, No. 1, pp. 6-9.

Ritala, et al. "Surface Roughness Reduction in Atomic Layer Epitaxy Growth of Titanium Dioxide Thin Films," Thin Solid-Films, vol. 249, No. 2 (Sep. 15, 1994), pp. 155-162.

Rossnagel, et al. "Plasma-enhanced Atomic Layer Deposition of Ta and Ti for Interconnect Diffusion Barriers," J. Vacuum Sci. & Tech. B., vol. 18, No. 4 (Jul. 2000), pp. 2016-2020.

Shenai, et al. "Correlation of vapor pressure equation and film properties with trimethylindium purity for the MOVPE grown III-V compounds," Journal of Crystal Growth 248 (2003) pp. 91-98.

"$Ta(N_tC_5H_{11})[N(CH_3)_2]$ Taimata®," <http://c1005059.securesites.net/topic/Taimata/Taimata-E.htm>, Jun. 13, 2007, pp. 1-3.

Notice of Reasons for Rejection dated Nov. 4, 2009, for Japanese Patent Application No. P2003-551340.

* cited by examiner

CYCLICAL DEPOSITION OF REFRACTORY METAL SILICON NITRIDE

CROSS-REFERENCE TO RELATED APPLICATIONS

This application is a continuation of U.S. Ser. No. 10/199,419, filed Jul. 18, 2002, now U.S. Pat. No. 7,081,271, which claims benefit of U.S. Ser. No. 60/337,646, filed Dec. 7, 2001, which are both incorporated herein by reference.

BACKGROUND OF THE INVENTION

1. Field of the Invention

Embodiments of the invention generally relate to deposition of a semi-conductive layer onto a substrate. More specifically, the invention relates to a method of depositing a refractory metal layer using a cyclical deposition technique.

2. Description of the Related Art

The requirements of sub-quarter micron semiconductor devices with their VSLI or USLI integration necessitate using various layers, e.g., conductive layers and insulating layers. Typically, conductive layers are interconnected through features such as horizontal lines and vertical contact holes, vias, trenches, or openings in the insulating layer by a damascene or dual damascene process. With higher integration and increased device speed, the size of these features demands to be small, such as less than 0.25 micron of aperture, while the aspect ratio of the features, i.e., their height divided by width, needs to be greater than 5:1, and even greater than 10:1.

In the fabrication of semiconductor devices, such as dynamic random access memories (DRAMs), static random access memories (SRAMs), microprocessors, etc., insulating layers or barrier layers are used to separate conductive layers and prevent the diffusion of one material into an adjacent material. For example, diffusion barriers are needed to prevent copper diffusion, especially when an underlying low dielectric-constant dielectric layer is used. Low dielectric-constant materials are often soft and porous, and adhere poorly to adjacent materials. Therefore, a good barrier/adhesion layer is required for processing a low resistivity conductive layer, such as a copper layer, compatible with low dielectric-constant materials.

Diffusion barriers are also used to prevent undesirable reactions between conductive layers, such as spiking when aluminum contacts silicon surfaces, for example, and the formation of highly resistive alloy when aluminum comes into direct contact with tungsten. Further, diffusion resistant materials are used as adhesion or encapsulation materials or gate electrode liners for the high dielectric-constant dielectric layer in DRAM application.

Barrier/adhesion layers containing refractory metal materials are commonly used for VLSI and ULSI devices. Refractory metal materials with good adhesion properties to conductive layers, such as those containing titanium (Ti), tantalum (Ta), tungsten (W), titanium nitride (TiN), tantalum nitride (TaN), tungsten nitride (WN), etc., have been used in integrated circuit manufacturing to form liner/barrier layers.

Furthermore, a ternary refractory metal material, such as refractory metal silicon nitride, e.g. tantalum silicon nitride (TaSiN) and titanium silicon nitride (TiSiN), forms a superior barrier layer/adhesion layer over a binary refractory metal material such as tantalum nitride, titanium nitride, or tungsten nitride. In some example, the incorporation of silicon into a tantalum nitride layer by metal-organic chemical vapor deposition (MOCVD) to form a tantalum silicon nitride layer has been shown to provide as a better diffusion and/or insulation barrier for copper interconnects than tantalum nitride barriers. Also, the incorporation of silicon into a titanium nitride layer to form a titanium silicon nitride layer helps to prevent fluorine diffusion from subsequent tungsten applications that use tungsten fluoride ($WF_6$) as precursor. However, such deposition methods are performed at higher temperatures which may not be desirable for some applications, and have trouble controlling the composition of the barrier/adhesion layer, such as the ratio of the materials incorporated.

In addition, traditional deposition processes, such as physical vapor deposition (PVD) and chemical vapor deposition (CVD), have difficulty in filling high aspect ratio features and often result in poor step coverage, poor conformality, and byproduct formation. The complicated topography of devices with high aspect ratios requires precise control over film properties such as composition, thickness, morphology, and electrical characteristics. For example, conventional fabrication of titanium nitride adhesion layers used as tungsten liners often results in high and unpredictably variable contact resistance of the finished tungsten contact following fabrication. Typically, titanium nitride is deposited by decomposing a metal-organic compound of titanium using conventional CVD process and may contain carbon and oxygen impurities, resulting in an increase in resistivity of the adhesion layer. In addition, the carbon and oxygen impurities in the titanium nitride layer may react with the byproducts of a subsequently deposited tungsten plug resulting in the localized formation of nucleated insulating structures. The tungsten plug may be deposited by a CVD process after the reduction of tungsten fluoride ($WF_5$) or tungsten chloride ($WCl_5$) compounds by silane.

Cyclical deposition techniques, such as atomic layer deposition (ALD) and rapid sequential chemical vapor deposition, provide a better degree of control over substrate surface reactions and are suitable for the deposition of material layers over features having high aspect ratios to provide good step coverage. One example of forming a binary material layer using a cyclical deposition technique comprises the sequential introduction of pulses of a first precursor/reactant and a second precursor/reactant. For instance, one cycle may comprise a pulse of the first precursor, followed by a pulse of a purge gas and/or a pump evacuation, followed by a pulse of a second precursor, and followed by a pulse of a purge gas and/or a pump evacuation. Sequential introduction of separate pulses of different precursors results in the alternating self-limiting surface adsorption or chemisorption of the precursors on the substrate surface and forms a monolayer or less of the binary material for each cycle. In this way, thin films are grown as a monolayer or less at a time to form a deposited layer or film, e.g., a tantalum nitride layer using a tantalum-containing precursor and ammonia gas as precursors.

Although the deposition rate is slower in cyclical deposition processes than conventional CVD and PVD processes, deposition can be conducted in a simplified chamber/reactor where process conditions such as gas flow and deposition temperature are not as critical. Further, cyclical deposition processes can be performed at lower temperatures and can use a wider range of precursors. A satisfactory apparatus and method for cyclical deposition techniques have not been established to form conformal layers of ternary materials utilizing three precursors.

There is a need, therefore, for a repeatable and controlled method of depositing a ternary metal silicon nitride layer.

SUMMARY OF THE INVENTION

Embodiments of the invention relate to an apparatus and method of cyclical layer deposition utilizing three or more precursors. In one embodiment, the method includes introducing a pulse of a nitrogen-containing precursor and providing at least one cycle of precursors to form a ternary material layer. The nitrogen-containing precursor is introduced first to prevent diffusion of a refractory metal-containing precursor and a silicon-containing precursor into an underlying layer. Providing at least one cycle of precursors further includes introducing a pulse of the refractory metal-containing precursor, introducing a pulse of the nitrogen-containing precursor, and introducing a pulse of the silicon-containing precursor. In one aspect of this embodiment, the nitrogen-containing precursor and the silicon-containing precursor are sequentially introduced. In another aspect, they are introduced at the same time.

In another embodiment, the method includes introducing a pulse of a first precursor, introducing a pulse of a second precursor, repeating the introduction of the first and the second precursors at least one time to form a binary material layer on the substrate surface, and introducing a pulse of a third precursor to form the ternary material layer. In one aspect of this embodiment, a method of forming a refractory metal silicon nitride layer on a substrate surface includes providing at least one cycle of precursors to form a refractory metal nitride layer before introducing a pulse of a silicon-containing precursor to form the refractory metal silicon nitride layer.

An optional plasma treatment step may be performed at various stages, e.g., either during and/or after formation of the ternary material layer. Also provided are methods of forming tantalum silicon nitride and titanium silicon nitride barrier/adhesion layers on a substrate, and a method of forming a copper film or a tungsten plug having an underlying refractory metal silicon nitride layer.

BRIEF DESCRIPTION OF THE DRAWINGS

So that the manner in which the features of the invention are attained and can be understood in detail, a more particular description of the invention, briefly summarized above, may be had by reference to the embodiments thereof, which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

A method of forming a ternary material layer on a substrate surface using a cyclical deposition technique is provided. The method includes delivery of at least three precursors to a substrate in which delivery of two of the at least three precursors is performed simultaneously or sequentially. For example, first and second precursors are introduced simultaneously before a third precursor is introduced. Alternatively, a first precursor is introduced, then a second precursor is sequentially introduced before introducing a third precursor. Accordingly, the composition of the ternary material layer is adjusted to the requirements of different applications using different deposition flow sequences as described below.

The term "cyclical deposition" as used herein refers to cyclically flowing two or more reactants over a surface of a structure/substrate to form a thin layer and includes processing techniques such as atomic layer deposition and rapid sequential chemical vapor deposition. The term "ternary material" as used herein is defined as a material having a composition including three elements. The term "adsorption" and "adsorb" as used herein are meant to include chemisorption, physisorption, or any other phenomenon allowing atoms/molecules to bond, react, or adhere to an exposed surface. The term "substrate structure" refers to any workpiece upon which film processing is performed and may be used to denote a substrate, such as a semiconductor substrate or a glass substrate, as well as other material layers formed on the substrate, such as a dielectric layer or other layers.

Ternary Material Formation

Figure 1A:
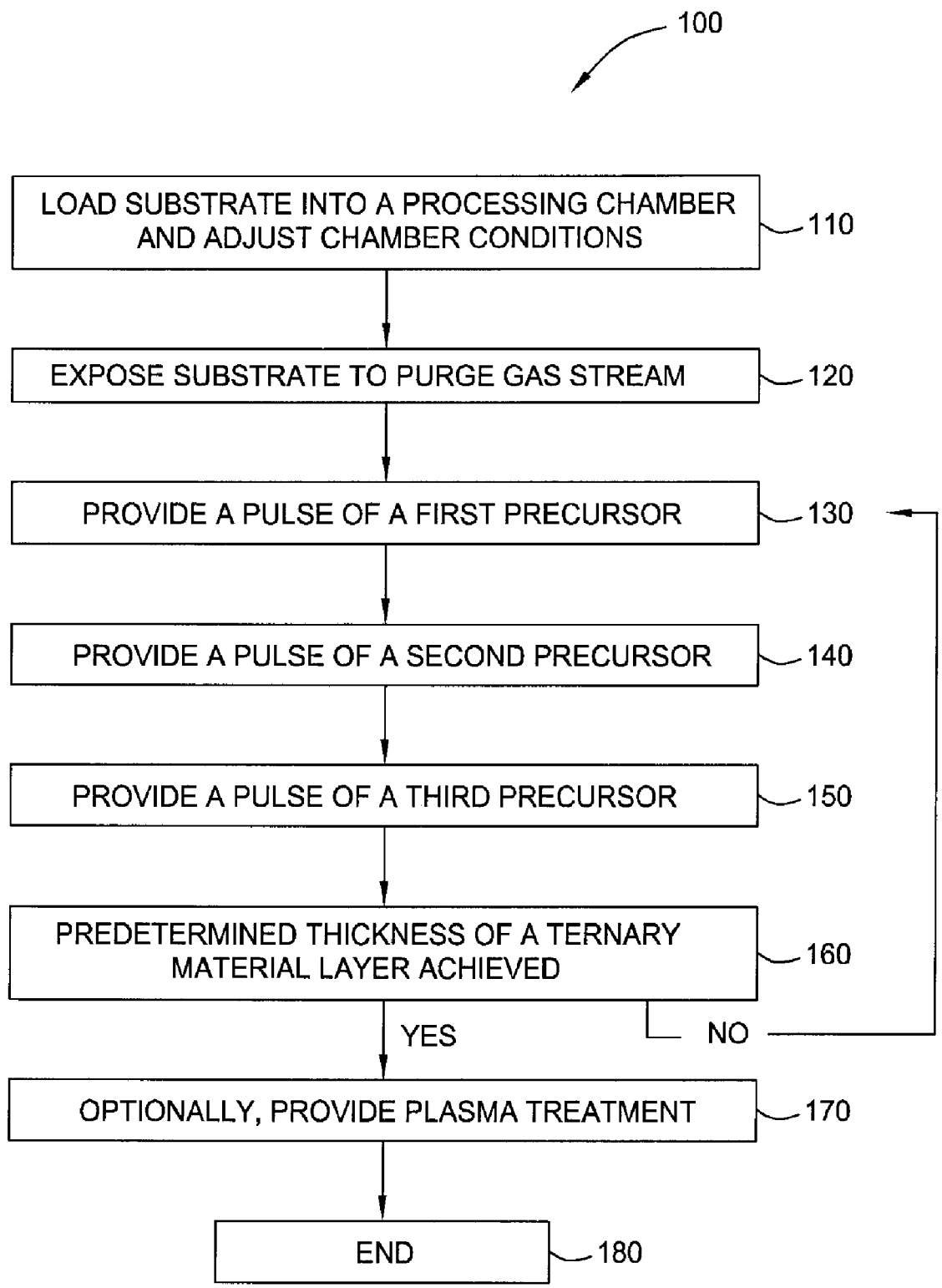
FIG. 1A is a schematic flow chart of a ternary layer cyclical deposition process involving sequential delivery of three precursors and an optional plasma treatment step.

In one embodiment, formation of a ternary material layer on a substrate surface is performed according to the flow sequences described in FIGS. 1A-1D. FIG. 1A depicts a flow sequence 100 involving three precursors using a cyclical deposition technique. Generally, a substrate is loaded to a process chamber and chamber conditions are adjusted at step 110. The chamber conditions correspond to a flow sequence, which is chosen for various underlying substrate materials and subsequent metallization schemes, such that the desired composition of the ternary layer is obtained. Typical chamber conditions include a temperature between about 175° C. and about 380° C., such as between about 250° C. and about 300° C., and a pressure of between about 0.5 Torr and about 50 Torr, such as between about 1 Torr and about 5 Torr.

At step 120, a purge gas is introduced as a continuous flow into the chamber. Examples of purge gases include, but are not limited to, helium (He), argon (Ar), nitrogen ($N_2$), and hydrogen ($H_2$).

At step 130, a first precursor is adsorbed on the structure/substrate surface by introducing a pulse of a first precursor into the processing chamber to form a monolayer or less of the first precursor which may not saturate the whole substrate surface. In one embodiment, a precursor that adsorbs on a substrate surface without diffusion into an underlying layer of the substrate is deposited as the first precursor. For example, a nitrogen-containing precursor is preferably chosen as the first precursor, such that diffusion of the deposited material can be avoided.

At step 140, a second precursor is adsorbed on the structure/substrate surface by introducing a pulse of the second precursor into the processing chamber. At step 150, a third precursor is sequentially adsorbed on the substrate surface by introducing a pulse of a third precursor into the chamber. The three precursors may be optionally provided with the aid of a carrier gas. Examples of carrier gases include, but are not limited to, helium (He), argon (Ar), nitrogen ($N_2$), and hydrogen ($H_2$), and other gases. The purge gas and the carrier gas may include different gas flows or may include the same gas flow. If the purge gas and the carrier gas include different gas flows, the purge gas and the carrier gas preferably include the same type of gas. An evacuation of various gases is typically accompanied using a vacuum pump.

Typically, each of the three precursors is delivered at a flow rate of between about 5 sccm and about 5,000 sccm, such as between about 50 sccm and about 300 sccm. In addition, each introduction is performed for a short period of pulsing time, such as a pulse in seconds at each step, and stopped for another period of time, usually in seconds such as about 30 seconds or less, to remove any unreacted precursor or byproduct formation from the chamber after each step by the purge gas introduced at step 120.

The duration of each pulse of the three precursors is variable and the duration between each pulse is also variable. The variation depends on the different materials used, the flow sequence used, the volume capacity of the deposition chamber, the vacuum system coupled to the chamber, among other processing conditions. Typical duration between each pulse for each precursor is between about 50 milliseconds and about 30 seconds, such as between about 100 milliseconds and about 5 seconds.

Alternatively, the purge gas introduced as a continuous flow at step 120 may be provided as a pulse after the introduction of each precursor at steps 130, 140, and 150. The purge gas introduced and/or the vacuum pump evacuation introduced, whether continuously or as a pulse, can help to reduce the likelihood of gas phase reactions of the precursors due to excess amounts of the precursors remaining in the chamber and remove any remaining precursor, reactant, and by-product from the chamber.

The three precursors typically include atoms of an element with one or more reactive species. It is believed that the adsorption processes used to adsorb a precursor at each step is self-limiting in that one monolayer or less of the precursor may be adsorbed onto the substrate surface during a given pulse because the substrate surface has a finite number of reactive sites for adsorbing the precursor. Once the finite number of reactive sites is occupied by the precursor, further adsorption of any precursor will be blocked. Any of the precursor not adsorbed is flown out of the chamber as a result of the vacuum system, carrier gas flow, and/or purge gas flow.

Not wishing to be bound by theory, the second precursor introduced at step 140 may react with the reactive species of the first precursor to form a monolayer or less of a binary material. The sequential introduction of the third precursor at step 150 may react with the reactive species of the first precursor, the second precursor, or the binary material to form a monolayer or less of a ternary material. Each monolayer may be an atomic layer and may be about 5 Å or less, such as about 1 Å or less, depending on the materials to be deposited. The introduction of the three precursors is repeated at least once to form thin monolayers of a ternary material layer and the thickness of the ternary material layer is incrementally increased with each cycle.

After each deposition cycle, the total thickness of the ternary material is determined at step 160. As such, steps 130 through 150 are repeated when a desired thickness of the layer has not been achieved. However, the process is stopped as indicated by step 180 when the desired thickness of the ternary material layer is achieved. Typically, a ternary material layer having a thickness of about 100 Å or less is deposited.

Optionally, a plasma treatment step may be performed at step 170. The plasma treatment is believed to treat the surface of the deposited layer such that the deposited material is conformally more compact and the resistivity of the deposited material is reduced. In some cases, the thickness of the deposited layer is reduced by the plasma treatment. The gases used for plasma treatment is generated from a source gas including hydrogen, nitrogen, argon, helium, or a combination thereof, that is coupled to the processing chamber. The plasma treatment is performed at a temperature of less than about 380° C. and a pressure of less than about 10 Torr.

Figure 1B:
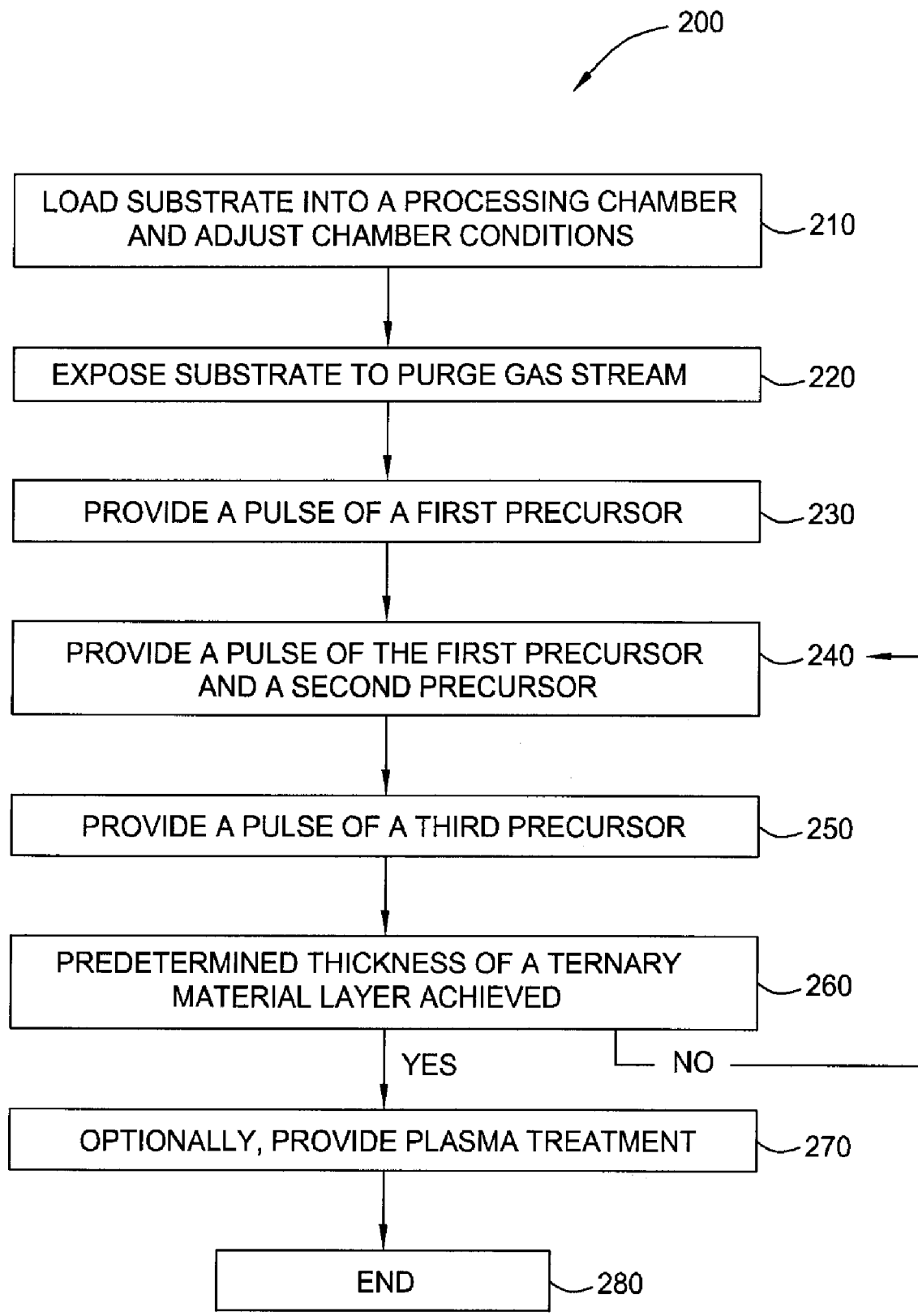
FIG. 1B is a schematic flow chart of a ternary layer cyclical deposition process in accordance with one embodiment where two precursors are introduced simultaneously prior to a third precursor is introduced.

FIG. 1B depicts a flow sequence 200 of a cyclical deposition process in accordance with one embodiment of the invention where two precursors are introduced simultaneously. It is believed that the concurrent delivery of a first precursor and a second precursor and the sequential delivery of a third precursor provides a ternary material layer including thin monolayers containing each element of the first precursor, the second precursor, and the third precursor at their atomic level.

The flow sequence 200 includes loading a substrate at step 210, exposing the substrate to a purge gas flow at step 220, and an optional step 230 to deliver a first precursor, followed by the concurrent delivery of the first and a second precursor at step 240. Next, a third precursor is delivered at step 250 to format least a monolayer of a ternary material layer.

Steps 240 and 250 are repeated cycled at least once to form a ternary material layer and the thickness of the ternary material layer is incrementally increased. After each deposition cycle, the total thickness of the ternary material layer is determined at step 260. As such, steps 240 through 250 are repeated if a desired thickness of the layer has not been achieved. An optional plasma treatment step similar to step 170 of the flow sequence 100 is provided at step 270. At step 280, the deposition process is stopped at a desired thickness of the ternary layer.

Figure 1C:
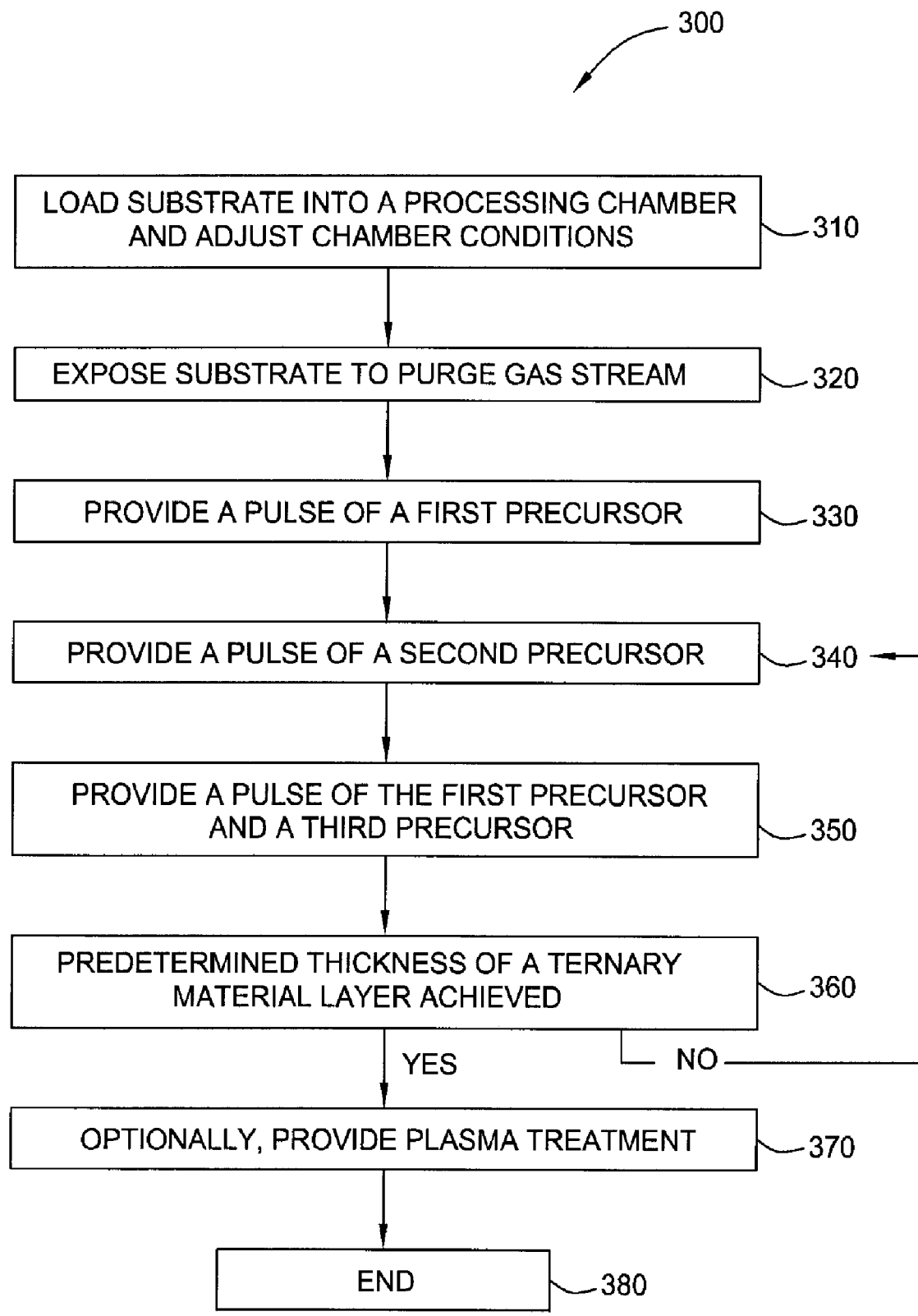
FIG. 1C is a schematic flow chart of a ternary layer cyclical deposition process in accordance with another embodiment where two precursors are introduced simultaneously after a first precursor and a second precursor are introduced.

FIG. 1C depicts a flow sequence 300 in accordance with another embodiment of the invention in which two precursors are introduced at the same time. The flow sequence 300 includes an optional step 330 to deliver the first precursor and the sequential delivery of a second precursor at step 340. For example, a first precursor is preferably chosen and introduced at step 330 to avoid diffusion of any material to be deposited into the underlying substrate structure/surface. The flow sequence 300 further includes simultaneous delivery of a first and a third precursors at step 350.

Steps 340 and 350 are then repeated/cycled at least once to form a ternary material layer and the thickness of the ternary material layer is incrementally increased. After each deposition cycle, the total thickness of the ternary material layer is determined at step 360, and steps 340 through 350 are repeated when a desired thickness of the layer has not been achieved. Step 370 provides an optional plasma treatment step. The process is stopped at step 380 after a desired thickness of the ternary layer is achieved.

Not wishing to be bound by theory, it is believed that the simultaneous introduction of two precursors as described above with reference to FIGS. 1B and 1C creates a competition between the two precursors to adsorb onto the substrate surface and react with another precursor, which is believed to provide a conformally deposited ternary material layer.

Diffusion into a porous underlying low dielectric-constant dielectric layer is a problem with some precursors. Therefore, the delivery of the first precursor is included to provide adsorption of the first precursor without diffusing into the substrate such that diffusion of the second and/or the third precursors into the underlying layer is avoided. In one embodiment, a first precursor is a precursor that shows less tendency, as compared to a second precursor and a third precursor, to diffuse into the substrate. For example, a nitrogen-containing precursor will not diffuse into the dielectric layer whereas a silicon-containing precursor and a refractory metal-containing precursor cause diffusion problem as the first precursor. This is especially important for depositing a ternary material layer to serve as a barrier layer for copper metallization when a porous underlying low-k dielectric layer is present. As a result, pre-cyclical deposition steps 230 and 330 are performed prior to the cyclical deposition of steps 240 and 250 in the flow sequence 200 and steps 340 and 350 in the flow sequence 300.

Figure 1D:
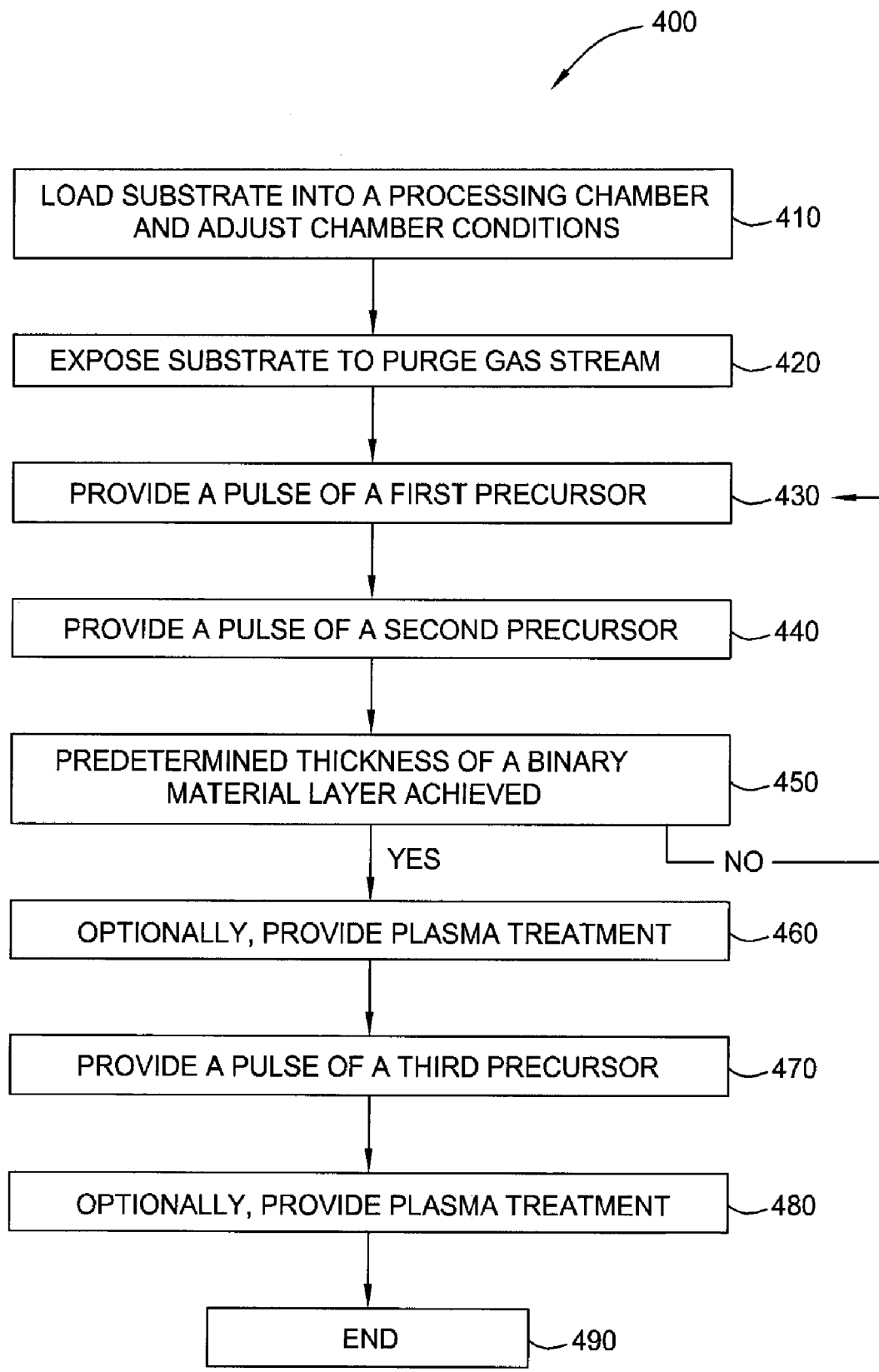
FIG. 1D is a schematic flow chart of a ternary layer cyclical deposition process in accordance with one embodiment where two precursors are introduced to perform cyclical deposition of a binary layer before a third precursor is introduced to a ternary layer.

FIG. 1D depicts a flow sequence 400 of a cyclical deposition process in accordance with another embodiment of the invention where two precursors are cyclically introduced to form a binary material layer before a third precursor is introduced. The flow sequence 400 provides a cyclical deposition of a first and a second precursor introduced at steps 430 and 440 to form a predetermined thickness of a binary material layer at step 450. At step 470, a pulse of a third precursor is then introduced to form a thin ternary material layer on the substrate surface.

At step 480, an optional plasma treatment step is introduced into the flow sequence 400 before ending the deposition process at step 490. Alternatively, the plasma treatment step may be performed prior to the pulse of the third precursor being introduced into the chamber, as shown at step 460. In this instance, the processing chamber is purged prior to the pulse of the third precursor delivered into the chamber with the subsequent formation of the ternary material layer onto the substrate.

Sequential delivery of the three precursors as demonstrated in FIGS. 1A-1D is provided to adjust the composition of the ternary material layer according to the requirements of different applications. This is achieved, for example, by adjusting the duration for each pulse of the three precursors, the flow rate for delivery of the three precursors, the deposition pressure for each pulse of the three precursors, the different flow sequences described herein, and other factors.

Refractory Metal Silicon Nitride Formation

Exemplary methods of forming a ternary material layer such as a refractory metal silicon nitride layer are described below. The methods involve cyclically depositing a refractory metal-containing precursor, a nitrogen-containing precursor, and a silicon-containing precursor on a substrate surface, such as a surface of an underlying dielectric layer or gate dielectric electrode. Various exemplary flow sequences as described below can be used to adjust the composition, silicon incorporation level, thickness, density, and step coverage of the refractory metal silicon nitride layer.

For example, a refractory metal silicon nitride layer formed by the flow sequences described herein may have a composition $R_xSi_yN_z$, where R is the refractory metal, the x value of the refractory metal is about 0.6 or less, and the y plus z value of the total silicon and nitrogen is about 0.4 or less, such as between about 0.4 and about 0.6 (x value) of refractory metal materials, between about 0.0001 and about 0.4 (y value) of silicon, and between about 0.0001 and about 0.4 (z value) of nitrogen.

One example includes a tantalum silicon nitride layer formed by the flow sequence 100 having about 55% of tantalum, about 15% of silicon, and about 30% of nitrogen. An exemplary titanium silicon nitride layer formed by the flow sequence 200 includes about 60% of tantalum, about 10% of silicon, and about 30% of nitrogen.

Tables 1-3 provide exemplary flow sequences A-H to demonstrate the use of three precursors, a nitrogen-containing precursor, a refractory metal-containing precursor, and a silicon-containing precursor to sequentially and cyclically form a refractory metal silicon nitride layer in accordance with embodiments of the invention.

Exemplary flow sequences A-D using the flow sequence 100 to form a refractory metal silicon nitride layer are summarized in Table 1. In the exemplary flow sequences A-D, the monolayer formed by cyclical deposition of each precursor may be increased incrementally until a thickness of about 100 Å or less of a refractory metal silicon nitride layer is formed. The refractory metal silicon nitride layer is a tantalum silicon nitride layer or a titanium silicon nitride layer, depending on the refractory metal-containing precursor used.

TABLE 1

Exemplary flow sequences in accordance with embodiments of the flow sequence 100.

| Precursors | Example A | Example B | Example C | Example D |
|---|---|---|---|---|
| 1st precursor | a nitrogen-containing precursor | a nitrogen-containing precursor | a refractory metal-containing precursor | a refractory metal-containing precursor |
| 2nd precursor | a refractory metal-containing precursor | a silicon-containing precursor | a silicon-containing precursor | a nitrogen-containing precursor |
| 3rd precursor | a silicon-containing precursor | a refractory metal-containing precursor | a nitrogen-containing precursor | a silicon-containing precursor |

In one aspect, the nitrogen-containing precursor is chosen as the first precursor to be introduced into the chamber because the other two precursors, the refractory metal-containing precursor and the silicon-containing precursor, have a higher propensity to diffuse into an underlying layer, such as a dielectric layer, especially a porous low-dielectric constant dielectric layer.

In another aspect, exemplary flow sequences A-B are performed by the flow sequence 100 such that the order of the introduction of the silicon-containing precursor and the refractory metal-containing precursor is provided to adjust the composition in the thus formed refractory metal silicon nitride layer. For example, it has been observed that a refractory metal silicon nitride layer formed by the exemplary flow sequence B results in higher silicon incorporation than another refractory metal silicon nitride layer formed by the exemplary flow sequence A.

In the exemplary flow sequences C and D, a refractory metal-containing precursor is delivered into a processing chamber prior to the sequential delivery of the other two precursors as compared to the exemplary flow sequences A and B where a nitrogen-containing precursor is delivered into a processing chamber first. In one embodiment, it is intended that the order of the two precursors, a nitrogen-containing and a silicon-containing precursor, may be reversed to form a tantalum silicon nitride layer such that the composition of the thus formed refractory metal silicon nitride layer can be adjusted.

TABLE 2

Exemplary flow sequences in accordance with embodiments of the flow sequence 200 and 300.

| Precursors | Example E | Example F |
| --- | --- | --- |
| 1$^{st}$ precursor | a nitrogen-containing precursor | a nitrogen-containing precursor |
| 2$^{nd}$ precursor | a silicon-containing precursor | a refractory metal-containing precursor |
| 3$^{rd}$ precursor | a refractory metal-containing precursor | a silicon-containing precursor |

Exemplary flow sequence E using the flow sequence 200 and exemplary flow sequence F using the flow sequence 300 to form a refractory metal silicon nitride layer are summarized in Table 2. In the exemplary flow sequences E and F, a nitrogen-containing precursor is the first precursor delivered into the processing chamber to prevent diffusion of the other two precursors into the substrate, and the nitrogen-containing precursor and a silicon-containing precursor are introduced simultaneously.

Not wishing to be bound by theory, it is believed that when the silicon-containing precursor is introduced together with the nitrogen-containing precursor at steps 240 and 350 of the flow sequences 200 and 300, respectively, they compete with each other to adsorb onto the substrate surface and react with the refractory metal-containing precursor, prior to the adsorption of the refractory metal-containing precursor at step 250 of the flow sequences 200 or after the adsorption of the refractory metal-containing precursor at step 340 of the flow sequences 300. Such competition and cycling of steps 240 and 250 in the flow sequence 200 and competition and cycling of steps 340 and 350 in the flow sequence 300 enhance the formation of a true refractory metal silicon nitride layer, such as a tantalum silicon nitride layer or a titanium silicon nitride layer. Accordingly, the composition of the tantalum silicon nitride layer or the titanium silicon nitride layer can be adjusted to the need of different metallization schemes.

Exemplary flow sequences G and H using the flow sequence 400 to form a refractory metal silicon nitride layer are summarized in Table 3. In the exemplary flow sequences G and H, a nitrogen-containing precursor and a refractory metal-containing precursor are introduced as the first or the second precursors to perform cyclical deposition of a refractory metal nitride layer before a third silicon-containing precursor is introduced. The refractory metal nitride layer formed may be a tantalum nitride layer (TaN) or a titanium nitride layer (TiN).

TABLE 3

Exemplary flow sequences in accordance with embodiments of the flow sequence 400.

| Precursors | Example G | Example H |
| --- | --- | --- |
| 1$^{st}$ precursor | a nitrogen-containing precursor | a refractory metal-containing precursor |
| 2$^{nd}$ precursor | a refractory metal-containing precursor | a nitrogen-containing precursor |

TABLE 3-continued

Exemplary flow sequences in accordance with embodiments of the flow sequence 400.

| Precursors | Example G | Example H |
| --- | --- | --- |
| 3$^{rd}$ precursor | a silicon-containing precursor | a silicon-containing precursor |

Further, the silicon-containing precursor is provided to incorporate a low-level of silicon into the surface of the deposited tantalum nitride (TaN) or titanium nitride (TiN) layer. The resulting substrate surface includes a thin monolayer of about 10 Å or less of tantalum silicon nitride (TaSiN) or titanium silicon nitride (TiSiN) to serve as a barrier layer or an adhesion layer for subsequent metallization applications. In addition, the thus deposited layer as a whole deposited by the flow sequences 400 serves as, for example, a better barrier layer for copper metallization or a better adhesion layer for tungsten metallization than the deposited tantalum nitride (TaN) or titanium nitride (TiN) layer alone.

It is believed that tantalum silicon nitride (TaSiN) or titanium silicon nitride (TiSiN) adheres well to subsequent conductive metal material, such as copper, tungsten, and others, and prevents the diffusion of the subsequent conductive metal material into the underlying substrate material, better than tantalum nitride (TaN) or titanium nitride (TiN).

The sequential introduction of reactants or precursors in examples A-H may be repeated to deposit a plurality of thin layers to form a conformal refractory metal silicon nitride layer to a desired thickness. The flow rate for introducing the refractory metal-containing precursor is generally between about 10 sccm and about 1,000 sccm, such as between about 50 sccm and about 250 sccm with or without a carrier gas. The flow rate for introducing the nitrogen-containing precursor is typically between about 100 sccm and about 5,000 sccm, such as between about 250 sccm and about 1,000 sccm, and the flow rate for introducing the silicon-containing precursor is between about 5 sccm and about 500 sccm, such as between about 50 sccm and about 150 sccm.

Deposition Precursors

For the formation of a refractory metal silicon nitride barrier/adhesion layer using a cyclical deposition technique, a refractory metal monolayer is formed using metal-organic or inorganic halide refractory metal-containing precursors. A silicon monolayer is formed using silicon-containing precursor, and a nitrogen monolayer is formed using nitrogen-containing precursors.

Precursors are selected based on vapor pressure, chemical property, subsequent metallization schemes, and availability. Precursors in a cyclical deposition application should be highly reactive with each other, require short pulsing times, and enhance the purity of a film. Table 4 is a list of exemplary precursors that may be used for depositing a refractory metal silicon nitride layer using a cyclical deposition technique described above.

For example, metal-organic precursors such as tantalum-containing PDMAT or PEMAT, or titanium-containing TDMAT or TEMAT, are useful for the cyclical deposition or atomic layer deposition of a refractory metal-containing barrier layer for subsequent applications, such as to serve as a copper barrier or tungsten liner. In one embodiment, it is contemplated that any metal-organic refractory metal-containing precursor suitable for deposition of tantalum, tantalum nitride, tantalum silicon nitride, titanium, titanium nitride, or titanium silicon nitride may be used.

TABLE 4

Exemplary deposition precursors.

| Tantalum-containing precursors | Titanium-containing precursors |
|---|---|
| t-butylimino tris(diethylamido)tantalum (TBTDET): $^t$BuNTa(NEt$_2$)$_3$ | tetrakis(dimethylamido)titanium (TDMAT) |
| pentakis(ethylmethylamido)tantalum (PEMAT): Ta(NMeEt)$_5$ | tetrakis(ethylmethylamido)titanium (TEMAT) |
| pentakis(dimethylamido)tantalum (PDMAT): Ta(NMe$_2$)$_5$ | tetrakis(diethylamido)titanium (TDEAT) |
| pentakis(diethylamido)tantalum PDEAT: Ta(NEt$_2$)$_5$ | titanium tetrachloride: TiCl$_4$ |
| t-butylimino tris(ethylmethylamido)tantalum(TBTMET): $^t$BuNTa(NEtMe)$_3$ | titanium tetraiodide: TiI$_4$ |
| t-butylimino tris(dimethylamido)tantalum (TBTDMT): $^t$BuNTa(NMe$_2$)$_3$ | titanium tetrabromide: TiBr$_4$ |
| bis(cyclopentadienyl)tantalum trihydride: (Cp)$_2$TaH$_3$ | other titanium halides |
| bis(methylcyclopentadienyl)tantalum trihydride: (CpMe)$_2$TaH$_3$ | |

| Nitrogen-containing precursors | Silicon-containing precursors |
|---|---|
| ammonia: NH$_3$ | silane: SiH$_4$ |
| hydrazine: NH$_2$NH$_2$ | disilane: Si$_2$H$_6$ |
| methylhydrazine: (CH$_3$)(H)NNH$_2$ | methylsilane: CH$_3$SiH$_3$ |
| dimethylhydrazine: (CH$_3$)$_2$N$_2$H$_2$ | dimethylsilane: (CH$_3$)$_2$SiH$_2$ |
| t-butylhydrazine: (CH$_3$)$_3$C(H)NNH$_2$ | chlorosilane: ClSiH$_3$ |
| phenylhydrazine: C$_6$H$_5$N$_2$H$_3$ | dichlorosilane: Cl$_2$SiH$_2$ |
| azotertbutane: 2,2'-(CH$_3$)$_6$C$_2$N$_2$ | trichlorosilane: Cl$_3$SiH |
| ethylazide: C$_2$H$_5$N$_3$ | |

In another embodiment, it is contemplated that inorganic precursors such as tantalum halides or titanium halides are useful as refractory metal-containing precursors for subsequent application, such as tungsten metallization.

The nitrogen-containing precursor is selected for its ability to reduce a refractory metal-containing precursor, thus forming a refractory metal nitride film. Some refractory metal-containing precursors have a double bond, such as TBTDET, and could require a stronger reducing agent than ammonia gas, e.g., hydrazine, methylhydrazine, dimethylhydrazine and t-butylhydrazine, in order not to slow down the deposition rate of the refractory metal silicon nitride layer.

Silane or substituted silanes are highly reactive compounds at low temperatures, such as the chamber temperature used herein for a cyclical deposition technique, and provide an excellent source of silicon to incorporate into the layer.

Deposition Chambers

Figure 2A:
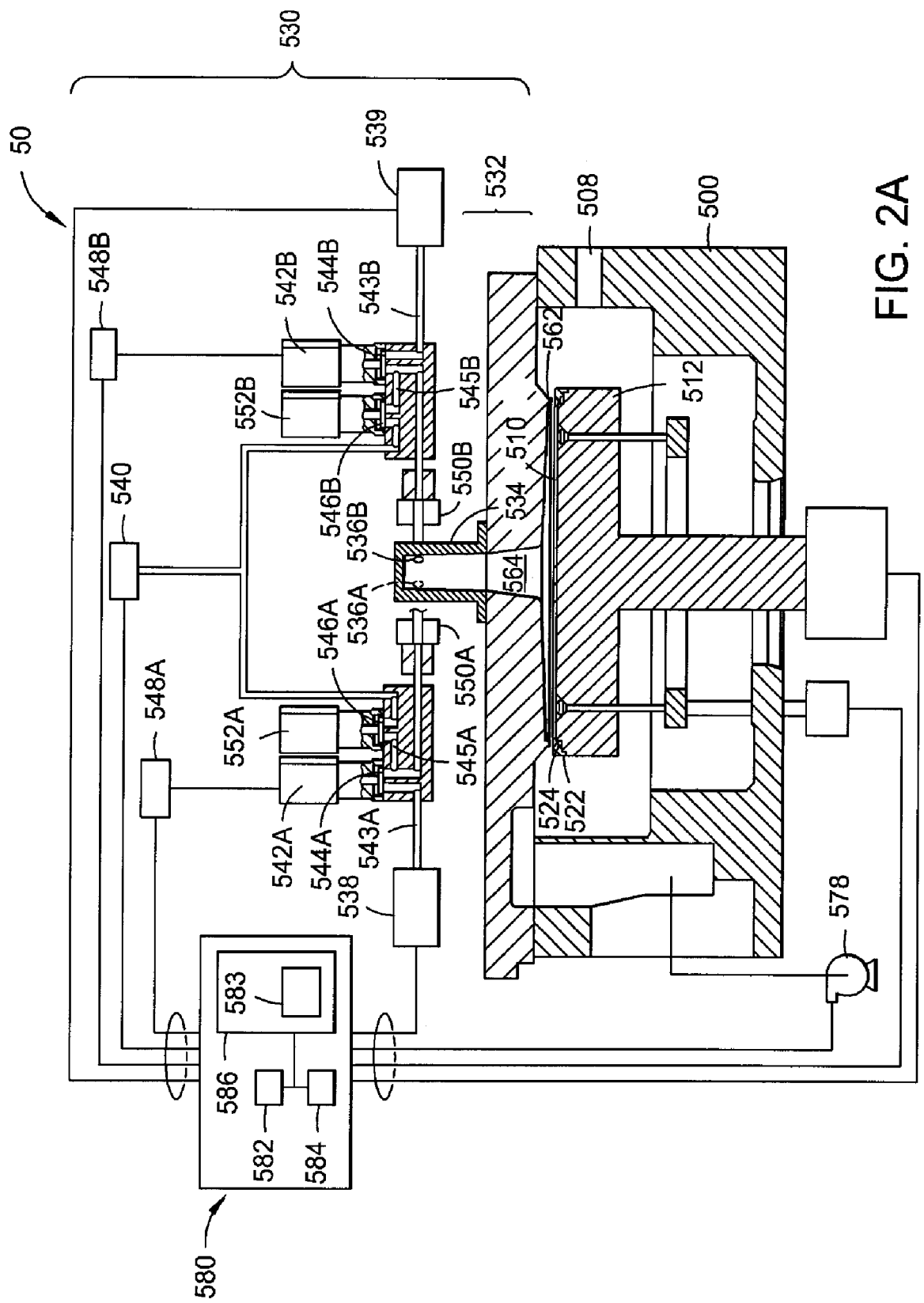
FIG. 2A depicts a schematic view of a deposition chamber to perform cyclical deposition of a metal silicon nitride layer.

FIG. 2A depicts a schematic cross-sectional view of a processing system 50 that can be used in accordance with embodiments described herein. Details of the processing system 50 are described in U.S. Ser. No. 10/032,284, entitled "Gas Delivery Apparatus and Method for Atomic Layer Deposition," filed on Dec. 21, 2001, and issued as U.S. Pat. No. 6,916,398, which is incorporated by reference herein. In addition, cyclical deposition utilizing three or more precursors may be performed in other chambers as well, such as a TXZ® chamber and a SPRINT™ PLUS chamber, both available from Applied Materials, Inc., located in Santa Clara, Calif.

The processing system 50 generally includes a process chamber 500, a gas delivery apparatus 530, a control unit 580, along with other hardware components such as a number of power supplies (not shown) and vacuum pumps. One vacuum pump 578 is shown in FIG. 2A. The vacuum pump 578 evacuates gases from the chamber 500 and helps maintain chamber pressure within a desired pressure range. The salient features of process chamber 500 are briefly described below.

The chamber 500 comprises a substrate support 512, which may be heated, such as by a resistive heater or a radiant heat source, to heat a substrate 510 disposed thereon prior to or during deposition. The substrate temperature can be maintained or controlled at a desired temperature range suitable for a deposition process, for example, between about 20° C. to about 500° C. A temperature window for precursors disclosed herein is less than about 380° C. In general, a temperature window for substrate temperature is that range of temperatures that induces adsorption of the precursors onto the substrate, generally below the thermal decomposition temperature for a particular precursor. A temperature sensor, such as a thermocouple, is typically embedded in the substrate support 512 to monitor the substrate temperature. In addition, a purge ring 522 may be disposed on the substrate support 512 to define a purge channel 524, which provides a purge gas to a peripheral portion of the substrate 510 to prevent deposition thereon.

The chamber 500 also includes a chamber lid 532 connecting with a gas delivery apparatus 530 at an upper portion of the chamber 500 to provide a gas, such as a process gas, a reactant/precursor gas, and/or a purge gas, to the chamber 500. The chamber lid 532 includes an expanding channel 534, extending from a central portion to a peripheral portion of the chamber lid 532 and having an increasing inner diameter to define a processing zone or a reaction zone 564 and to substantially cover the substrate surface. Particularly, the lower portion of the expanding channel 534, near the bottom of the reaction zone 564 and around the substrate surface, is dramatically expanded to cover the substrate surface and the lower portion of the expanding channel 534 may include one or more surfaces, such as a tapered surface, straight surface, concave surface, convex surface, and combinations thereof.

More particularly, the lower portion of the expanding channel 534 may be tapered and downwardly sloping in the shape of a cone to help reduce variations in the velocity of a reactant gas traveling through the lower portion to the substrate surface and provide uniform exposure of the reactant gas. Such an increase in diameter of the expanding channel 534 or tapered expansion of the lower portion of the expanding channel 534 around the substrate 510 results in a decreased gas flow when a process gas or purge gas travels through the expanding channel 534. As a result, an improved velocity profile of a gas flowing through the expanding channel 534 across the substrate surface, i.e., from the center of the substrate to the edge of the substrate, is achieved.

In general, the above design applies to an expanding channel 534 adapted to provide a total gas flow of between about 5 sccm and about 3,000 sccm. The reduction of the velocity of the gas flow helps reduce the likelihood that a gas flow will blow off reactants or precursors adsorbed on the surface of the substrate 510.

The chamber lid 532 further includes a choke structure 562 adjacent the periphery of the substrate 510 to restrict any gas flowing therethrough and to isolate the reaction zone 564 near the top portion of the chamber 500, away from the rest of the chamber portions such that a reactant gas or purge gas needs only adequately fill the reaction zone 564 to ensure sufficient exposure of the substrate 510 to the reactant gas or purge gas.

Since the reaction zone 564 includes a smaller volume compared to the inner volume of a conventional CVD chamber, less gas is required to fill the volume of the reaction zone 564.

Overall, the expanding channel 534 and the choke structure 562 of the chamber lid 532 are designed to help distribute the process gas or purge gas more uniformly and provide a more evenly controlled gas pressure adjacent the substrate 510 within the reaction zone 564. Typically, the chamber pressure is about 100 Torr or less. The chamber lid 532 may further include cooling elements and/or heating elements depending on the particular gas being delivered therethrough to prevent gas decomposition, deposition, or condensation on the chamber lid 532.

The gas delivery apparatus 530 is connected with the expanding channel 534 via gas inlets 536A, 536B located adjacent the upper portion of the expanding channel 534. Typically, the gas delivery apparatus 530 includes a number of purge gas sources 540 and carrier gas sources (not shown), a number of reactant/precursor gas sources 538, 539 and other gas sources, a number of reactant gas valves 542A, 542B and purge gas valves 552A, 552B, a number of valve seat assemblies 544A, 544B and purge gas valve seat assemblies 546A, 546B, a number of reactant gas lines 543A, 543B and purge gas lines 545A, 545B, and a number of gas conduits 550A, 550B, for flowing gases through the gas inlets 536A and 536B, into the expanding channel 534.

Figure 2B:
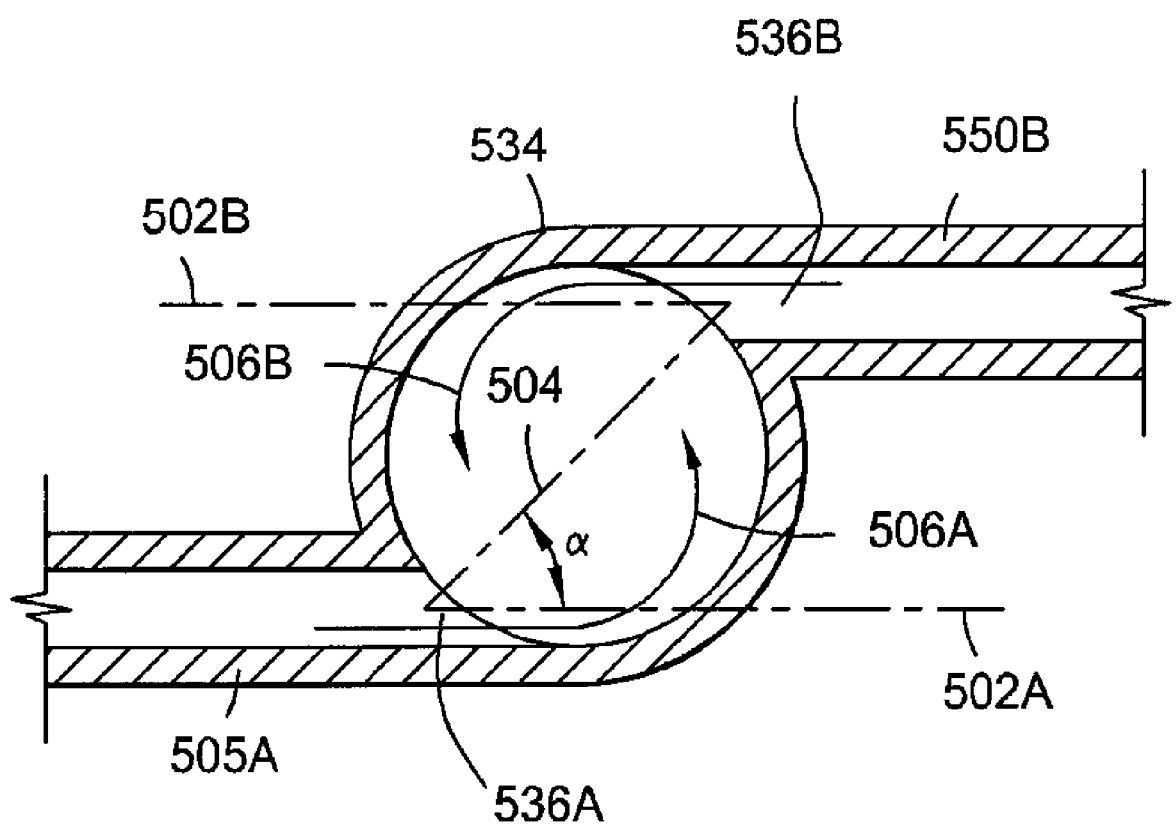
FIG. 2B depicts a schematic view of the top portion of an expanding channel of a deposition chamber.

FIG. 2B depicts a cross-sectional view of the top portion of the expanding channel 534 demonstrating the arrangements of the gas inlets 536A and 536B. As shown in FIG. 2B, each gas conduit 550A, 550B and gas inlet 536A, 536B may be positioned at an angle $\alpha$ from center lines 502A, 502B of the gas conduit 550A, 550B and from a radius line 504 of the center of the expanding channel 534. Entry of a gas through the gas conduit 550A, 550B preferably positioned at an angle $\alpha$ (i.e., when $\alpha>0°$) causes the gas to flow in a circular direction as shown by arrows 506A, 506B. By providing gas at an angle $\alpha$ as opposed to directly straight-on to the walls of the expanding channel 534 (i.e. when $\alpha=0°$), a more laminar flow in the same circular direction (i.e., clockwise or counterclockwise) through the expanding channel 534 rather than a turbulent flow is provided. In one embodiment of the invention, the distance between the gas inlets (536A, 536B, and others) and the substrate 510 is made far enough that the circular flow dissipates to a downwardly flow.

Figure 5A:
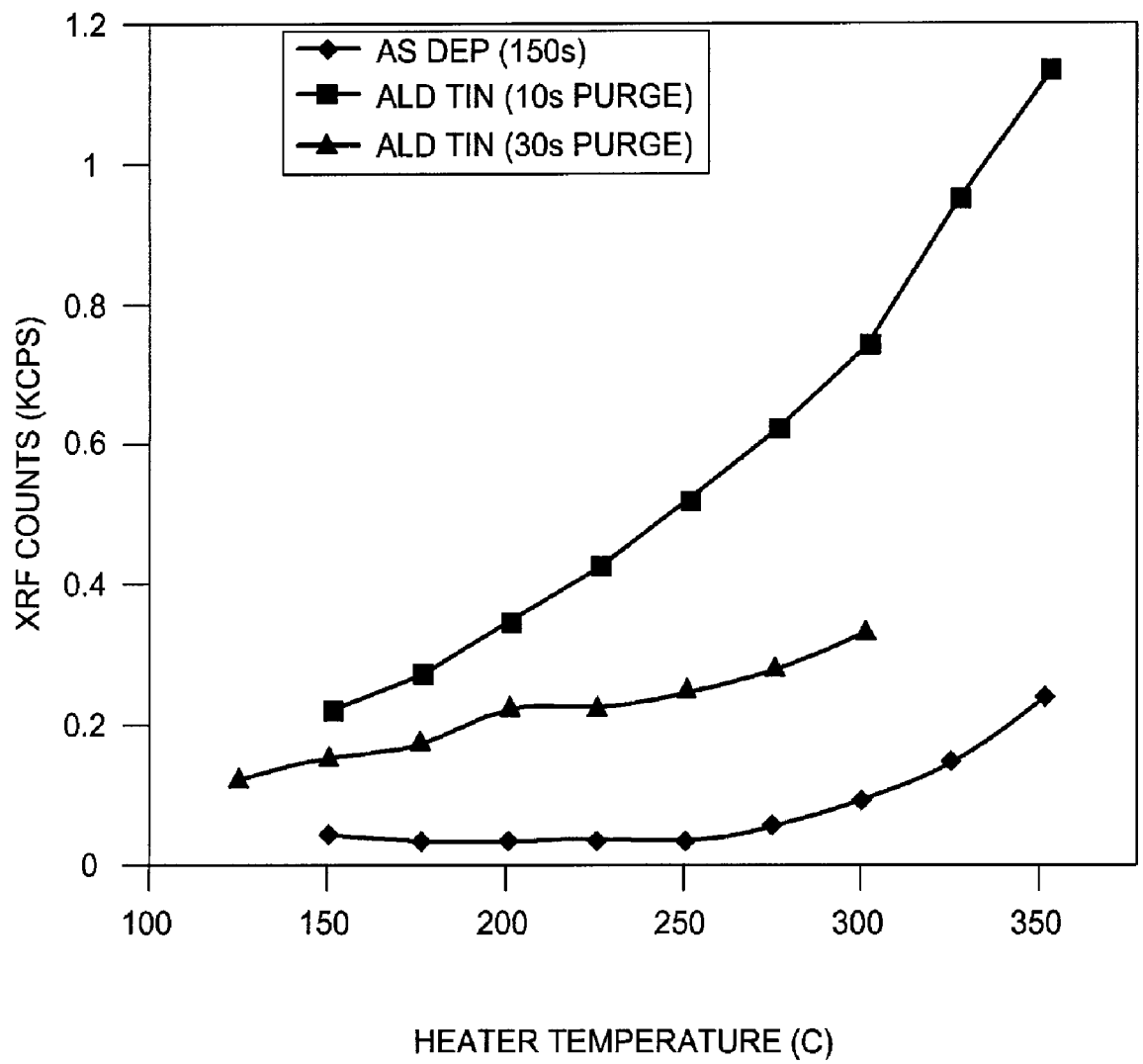
FIGS. 5A-5C are results performed by a flow sequence similar to the flow sequence 400 of FIG. 1D in accordance with embodiments of the invention.

Referring back to FIG. 2A, each gas conduit 550A, 550B and gas inlet 536A, 536B may be positioned horizontally as shown in FIG. 5A or may be angled downwardly or upwardly at an angle to provide a gas flow. In addition, the diameter of the gas conduits 550A, 550B may be increasing from the reactant gas lines 543A, 543B of the reactant gas valves 542A, 542B to the gas inlet 536A, 536B to help reduce the velocity of the gas flow prior to its entry into the expanding channel 534.

Process precursors, typically in a liquid or solid phase at room temperature, are stored in reactant gas sources 538, 539, and other additional gas sources. Prior to delivery to the chamber 500, the process precursors are heated to between about 30° C. and about 120° C. to convert into a vapor-gas phase by a device coupled to the gas sources, such as a bubbler or an ampoule. Alternatively, some precursors are vaporized directly into gas phase by another device, such as a direct liquid injector (DLI), coupled to the gas sources.

Reactant gases and/or purge gases are delivered from various gas sources through gas lines into various gas valves to provide a combined gas flow and/or separate gas flows. For example, reactant gas valves 542A, 542B and purge gas valves 552A, 552B are coupled to programmable logic controllers 548A and 548B to control the opening and actuation of the diaphragms of the valve seat assemblies 544A, 544B, 546A, 546B.

In one embodiment of the invention and with reference to gas valves 542A and 552A, a combined gas flow includes a continuous flow of a purge gas from the purge gas source 540 through purge gas line 545A and pulses of a reactant gas from the reactant gas source 538 through reactant gas line 543A. The combined gas flow is thus adjusted by controlling the diaphragm of the purge gas valve seat assembly 546A to leave the purge gas line 545A open and the diaphragm of the reactant gas valve seat assembly 544A to open and close the reactant gas line 543A for a period of reactant gas pulsing time determined by the flow sequences as described supra.

In another embodiment and with reference to gas valves 542A and 552A, separate gas flows includes pulses of a purge gas from the purge gas source 540 through purge gas line 545A and pulses of a reactant gas from the reactant gas source 538 through reactant gas line 543A. The separate gas flows are thus adjusted by controlling the diaphragms of the purge gas valve seat assembly 546A and of the reactant gas valve seat assembly 544A to open and close the purge gas line 545A and reactant gas line 543A for a period of pulsing time determined by the flow sequences as described supra.

A control unit 580, such as a programmed personal computer, work station computer, or the like, may be coupled to the chamber 500, the gas delivery apparatus 530, and other components of the chamber 500, to control processing conditions, such as the heating and monitoring of the substrate support 512, chamber pressure, and delivery of various gas flows, during different stages of a substrate processing flow sequence. Additionally, the control unit 580 monitors and regulates other activities used in substrate processing such as substrate transport.

For example, the control unit 580, coupled to logic controllers, 548A and 548B, is configured to control various process gas flows and purge gas flow from the gas sources 538, 539, 540 through the gas valves 542A, 542B, 552A, 552B. Furthermore, the control unit 580 may comprise a central processing unit (CPU) 582, a support circuitry 584, and a memory unit 586 containing associated control software 583. The associated control software is executed after the substrate 510 is positioned on the substrate support 512. The software routines, when executed, transform a general-purpose computer into a specific process computer that controls the chamber operation so that a chamber process is performed. Alternatively, the software routines may be performed in hardware, as an application specific integrated circuit or other type of hardware implementation, or a combination of software or hardware.

Optionally, a remote plasma source (not shown) may be coupled to the chamber 500 to clean deposits and reactive precursors formed on interior surfaces. The remote plasma source may include a plasma gas supply, a plasma gas flow controller, a plasma chamber, and a plasma chamber inlet. The plasma gas flow controller may be coupled to the control unit 580 to control the flow of a plasma gas from the plasma gas supply to the plasma chamber. An ignited plasma is typically generated by applying an electric field to the plasma gas in the plasma chamber and creating a plasma of reactive species using a radio-frequency (RF) power source, for example.

In operation, the tantalum-containing precursor, the nitrogen-containing precursor and the silicon-containing precursor stored within various reactant gas sources are pulsed into the expanding channel 534 of the chamber 500 through gas inlets 536A and 536B. For example, the tantalum containing-precursor may be stored at the reactant gas source 538 and delivered through gas inlet 536A, and the nitrogen-containing precursor and the silicon-containing precursor may be stored at different gas sources, such as gas sources 539 and others, but may share the same gas inlet 536B, since the nitrogen-containing precursor and the silicon-containing precursor will not react with each other at gas phase under the delivery conditions described herein.

In one embodiment of the invention, another one or more gas inlets may be located along the length of the expanding channel 534, preferably near the upper portion, to provide additional gases, such as a third precursor gas, into the chamber 500. In this aspect, the nitrogen-containing precursor and the silicon-containing precursor may be delivered into the chamber 500 through different gas inlets.

The gas flows of each purge gas and reactant gas, whether combined or separated, flow through the expanding channel 534 as a circular pattern and provide a sweeping action across the inner surface of the expanding channel 534. The circular pattern dissipates to a downwardly flow toward the surface of the substrate 510. The velocity of the gas flow reduces as it travels through the expanding channel 534. The gas flow then travels across the surface of the substrate 510 and across the bottom surface 560 of the chamber lid 532. The bottom surface 560 of the chamber lid 532, which is downwardly sloping, helps reduce the variation of the velocity of the gas flow across the surface of the substrate 510. The gas flow then travels by the choke 562 and into the pumping zone 566 of the chamber 500. Excess gas, by-products, etc. flow into the pumping channel 579 where they are exhausted from the chamber 500 by a vacuum system 578. In one aspect, the gas flow proceeds through the expanding channel 534 and between the surface of the substrate 510 and the bottom surface 560 of the chamber lid 532 in a laminar manner which aids in uniform exposure of a reactant gas to the surface of the substrate 510 and efficient purging of inner surfaces of the chamber lid 532.

In addition, one or two ignited plasmas, generated by a remote plasma chamber, may be introduced into the chamber 500 to treat the surface of the deposited layer. In FIGS. 1A-1D, the plasma treatment step is performed after a binary or ternary layer has been formed on the substrate.

Deposition of a Barrier Layer

Typically, formation of a refractory metal silicon nitride layer such as a tantalum silicon nitride ($Ta_xSi_yN_z$) layer or a titanium silicon nitride ($Ti_xSi_yN_z$) layer serves as a barrier/adhesion layer for subsequent metallization. For example, a metal refractory silicon layer may be used as a copper barrier or tungsten liner during a damascene metallization procedure, such as for lining dual damascene trenches and vias.

Figure 3:
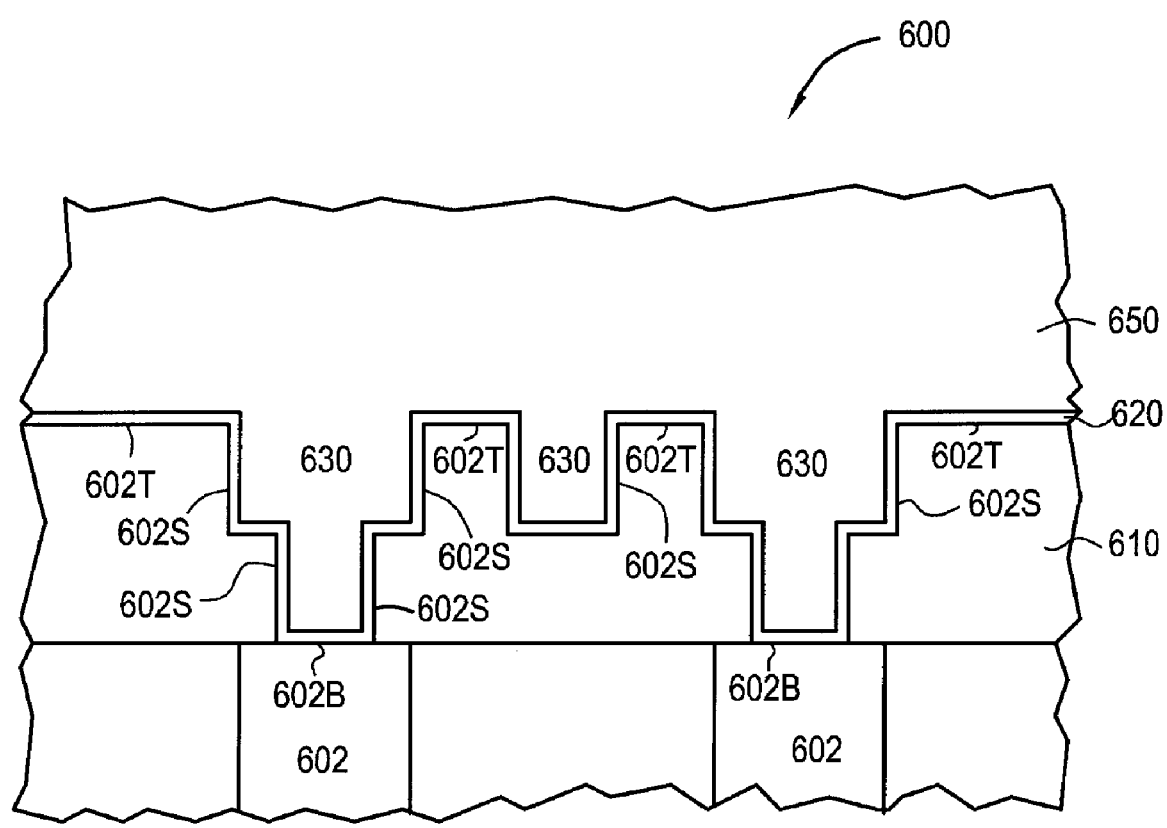
FIG. 3 depicts a schematic cross sectional view of an interconnect structure having a refractory metal silicon nitride barrier layer deposited thereon.

FIG. 3 depicts a schematic cross sectional view of a substrate structure 600 having a refractory metal silicon nitride barrier layer 620 deposited thereon in accordance with aspects of the invention. As shown, the substrate structure 600 includes an underlying dielectric layer 610 that has been patterned to form a recess 630, such as a via, a line, or a contact hole. These features are formed in dielectric materials by conventional photolithographic and etching techniques. In some cases, such recess has been patterned to contact another underlying conductive metal material 602. Alternatively, a substrate without a dielectric layer 610 formed thereon may be used to deposit a barrier/adhesion layer 620.

Materials that may be suitable for the dielectric layer 610 include, but are not limited to silicon dioxide, phosphorus-silicate-glass (PSG), boron silicate glass (BSG), boron doped phosphorus-silicate-glass (BPSG), fluoro-silicon glass (FSG), porous polymers (e.g., polyamides), carbon-containing silicon oxides (e.g., BLACK DIAMOND®, available from Applied Materials, Inc., of Santa Clara, Calif.), doped monocrystalline silicon, gallium-arsenide, silicon dioxide derived from tetraethyl orthosilicate (TEOS) or silane by plasma enhanced chemical vapor deposition (PECVD).

A tantalum silicon nitride or titanium silicon nitride barrier/adhesion layer 620 is deposited conformal and even, particularly on the sidewall 602S, bottom 602B, and top 602T of the dielectric layer 610, to provide good step coverage. In subsequent metallization steps, a metal layer 650, filled with copper or tungsten, for example, may be formed over the refractory metal silicon nitride barrier/adhesion layer through various deposition techniques such as electroplating, CVD, PVD, among others.

Example A

Figure 4:
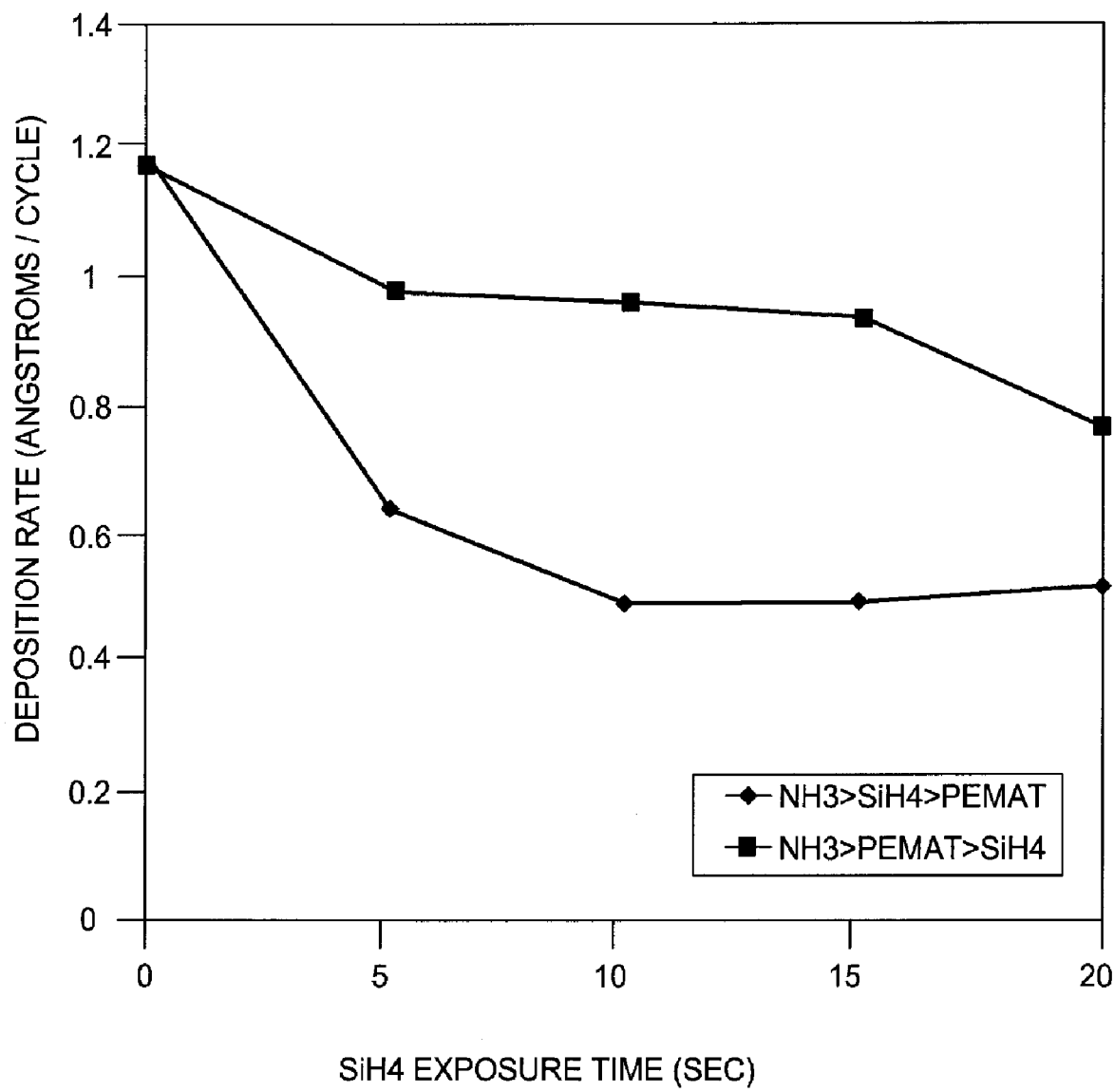
FIG. 4 is a comparison of results performed by flow sequences similar to the flow sequence 100 of FIG. 1A in accordance with embodiments of the invention.

FIG. 4 is a comparison of the results of two flow sequences similar to the flow sequence 100 in FIG. 1A where three precursors are sequentially introduced into the flow sequence to form a tantalum silicon nitride layer. The difference between these two flow sequences was the order of the second and the third precursors. The precursors in these two flow sequences were ammonia used as the first precursor, and silane and pentakis(ethylmethylamido) tantalum (PEMAT) used as the second and the third precursors or vice versa. The two flow sequences were performed at about 215° C. chamber temperature. As a test, delivery of the ammonia was at a flow rate of about 500 sccm and a deposition pressure of about 10 Torr for a pulse of about 10 seconds. Delivery of the PEMAT was at a flow rate of about 200 sccm for a pulse of about 10 seconds, with an argon carrier gas of a deposition pressure of about 5 Torr. Delivery of the silane was at a flow rate of about 50 sccm for a pulse of about 10 seconds, with an argon carrier gas of a deposition pressure of about 2 Torr at a flow rate of about 500 sccm.

The deposition rates for the two flow sequences as measured by Angstrom per cycle are shown as a function of silane exposure time in seconds. The results in FIG. 4 show that silicon incorporation for each pulse is saturated after about 5 seconds to about 10 seconds of exposure time and each pulse of the silane precursor is provided to increase the thickness of the thus formed tantalum silicon nitride layer to about 1.2 Å or less for each deposition cycle.

Significantly, the flow sequence of using ammonia, PEMAT, and silane as the first, second, and third precursors, respectively, results in about 13% of silicon incorporation into the final tantalum silicon nitride layer, which is higher than about 7% of silicon incorporation for the flow sequence of using ammonia, silane, and PEMAT as the first, second, and third precursors, respectively.

Example B

The results performed by a flow sequence similar to the flow sequence 400 in FIG. 1D form a titanium nitride layer prior to the formation of a titanium silicon nitride layer are summarized below. The precursors used were ammonia as the first precursor, tetrakis(dimethylamido) titanium (TDMAT) as the second precursor, and silane as the third precursor.

In FIG. 5A, the flow sequence is performed at various temperatures between about 150° C. and about 350° C. Decomposition of the titanium nitride layer as measured by X-ray fluorescence (XRF) counts in kilocounts per second (kcps) is shown as a function of the temperature of the heater for heating up the chamber. The results suggest that deposition is better at a temperature of about 250° C. or less because decomposition of the TDMAT precursor as indicated by the X-ray fluorescence (XRF) counts and starts at a temperature of about 250° C. or more. The decomposition is not as severe when a longer duration of a pulse of a purge gas is delivered to the chamber after the delivery of each of the first two precursors, TDMAT and ammonia.

Figure 5B:
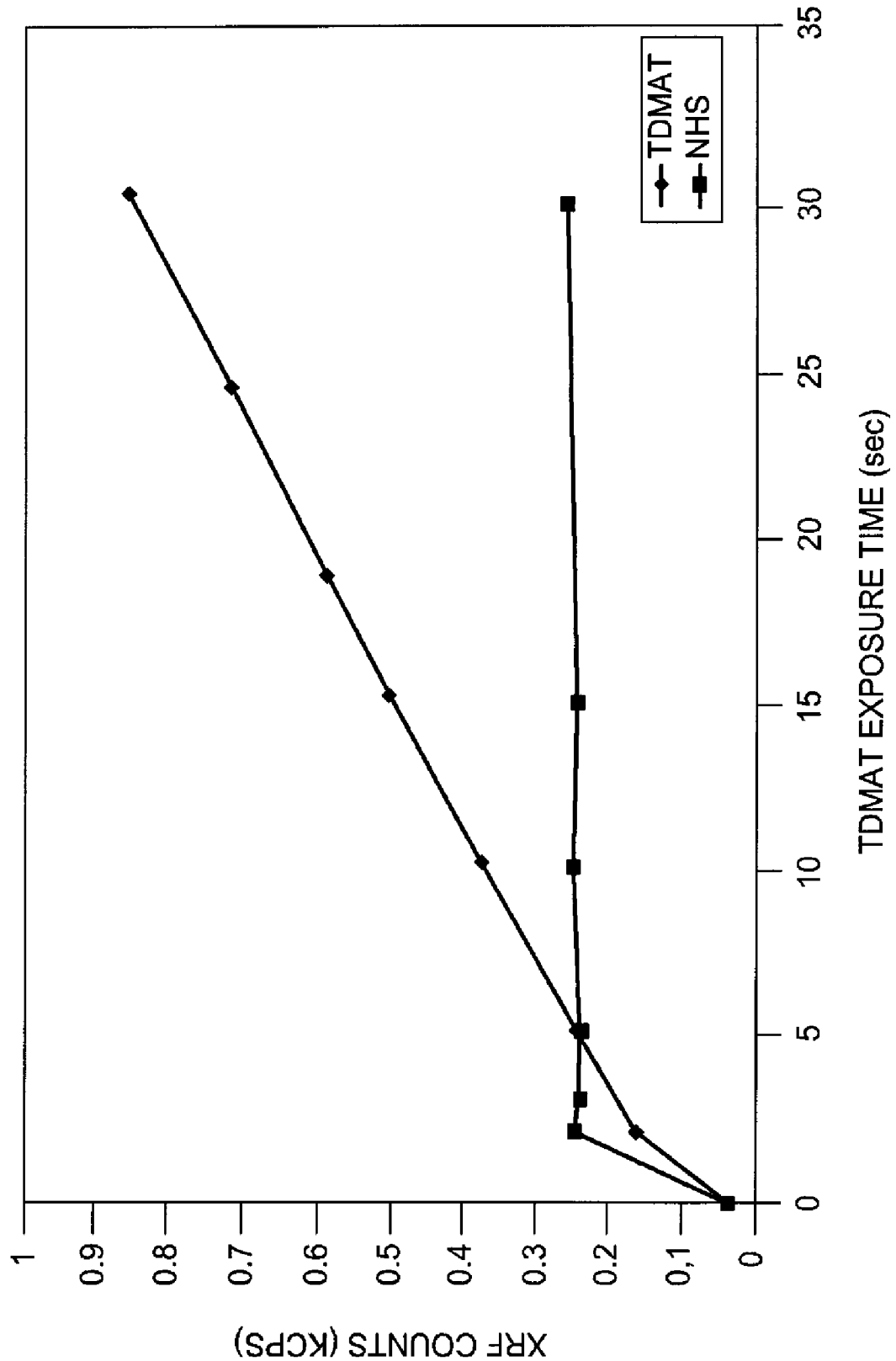
Figure 5C:
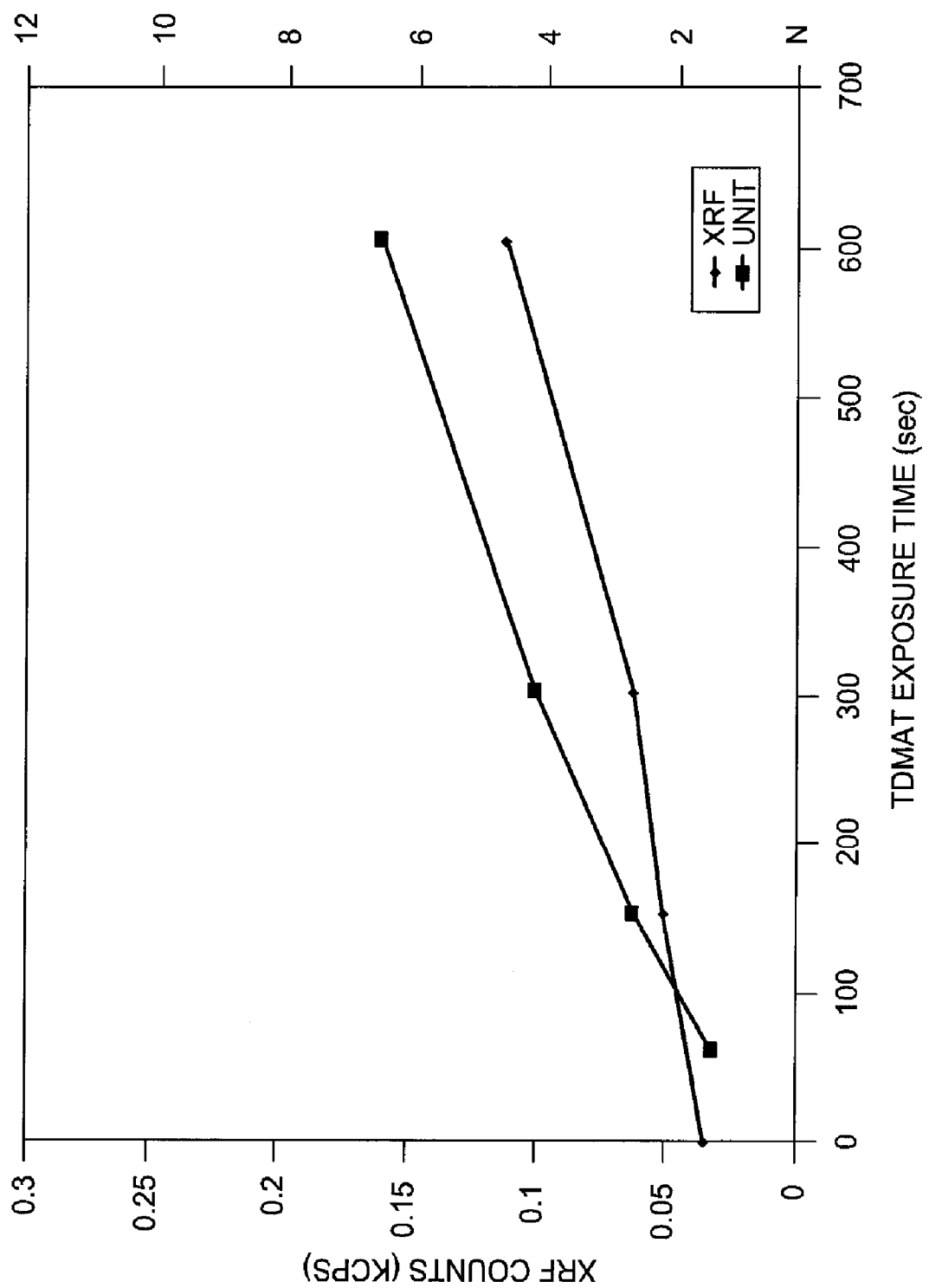

In FIGS. 5B-5C, the flow sequence was performed at a heater temperature of about 200° C. and TDMAT decomposition was measured by the X-ray fluorescence (XRF) counts as a function of the exposure time for each pulse of TDMAT. The measurements for the exposure time from about 2 seconds to about 30 seconds are shown in FIG. 5B for TDMAT and ammonia and the measurements for the exposure time from about 50 seconds to about 600 seconds are shown in FIG. 5C. Delivery of the ammonia was at a flow rate of about 500 sccm. Delivery of the TDMAT was at a flow rate of about 2 milligrams per minute, with a helium carrier gas at a flow rate of about 500 sccm. Delivery of the silane was at a flow rate of about 50 sccm for a pulse of about 10 seconds. The results suggest that minor TDMAT decomposition is still observed at the temperature as low as 200° C. if overexposure of the TDMAT occurs. In addition, in FIG. 5A, the ammonia is very stable and no decomposition occurs even under overexposure.

The deposition rates as measured by Angstrom per cycle are shown in FIGS. 5B and 5C as a function of TDMAT exposure time in seconds. The results in FIGS. 5B and 5C show that silicon incorporation for each pulse is saturated after about 5 seconds to about 10 seconds of exposure time and each pulse of the silane precursor is provided to increase the thickness of the formed tantalum silicon nitride layer to about 1.2 Å or less for each deposition cycle.

Figure 6:
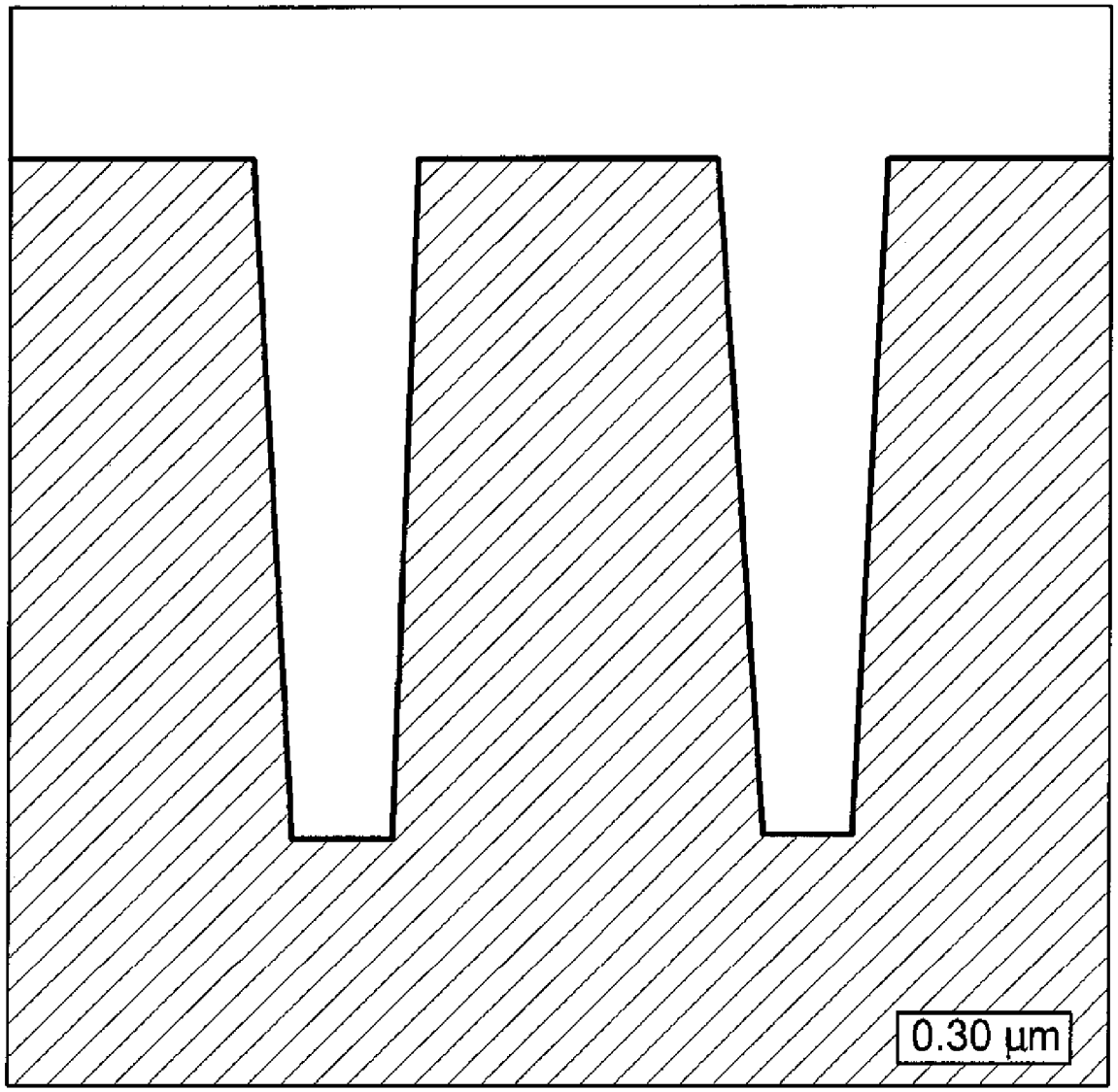
FIG. 6 is a TEM image of a via structure formed by a deposition method described herein.

FIG. 6 is a TEM image of a via structure formed by a cyclical deposition method according to the flow sequence 400 without performing the plasma treatment step (step 460) to form a tantalum silicon nitride (TaSiN) layer of about 15 Å. The TEM image of the overall via structure shows good step coverage. The tantalum silicon nitride layer is conformal and even deposited, particularly along the sidewall, bottom, and top of the via structure.

While foregoing is directed to various embodiments of the invention, other and further embodiments of the invention may be devised without departing from the basic scope thereof, and the scope thereof is determined by the claims that follow.

The invention claimed is:

1. A method for depositing a metal silicon nitride layer on a substrate, comprising:
    positioning a substrate within a process chamber comprising a centralized expanding channel that conically tapers towards and substantially covers the substrate;
    flowing a process gas into the centralized expanding channel to form a circular flow pattern;
    exposing the substrate to the process gas having the circular flow pattern; and
    exposing the substrate sequentially to chemical precursors during at least one cycle of an atomic layer deposition process to form a metal silicon nitride material thereon, comprising:
        pulsing a metal precursor into the process gas having the circular flow pattern;
        pulsing a nitrogen precursor into the process gas having the circular flow pattern; and
        pulsing a silicon precursor into the process gas having the circular flow pattern.

2. The method of claim 1, wherein the process gas having the circular flow pattern is exposed a center portion of the substrate and flows towards an outer edge of the substrate.

3. The method of claim 2, wherein the process gas comprises a gas selected from the group consisting of argon, nitrogen, hydrogen, helium, and combinations thereof.

4. The method of claim 2, further comprising exposing the substrate or the process gas to a plasma generated from one or more gases selected from the group consisting of hydrogen, helium, nitrogen, argon, and combinations thereof.

5. The method of claim 4, wherein the substrate is exposed to the plasma after depositing the metal silicon nitride material on the substrate.

6. The method of claim 4, wherein the process gas is exposed to the plasma during the pulsing of the metal precursor, the nitrogen precursor, the silicon precursor, or combinations thereof.

7. The method of claim 1, wherein the nitrogen precursor is a reactive compound formed by a plasma source.

8. The method of claim 7, wherein the plasma source is a remote plasma source.

9. The method of claim 1, wherein the substrate is exposed to the nitrogen precursor prior to starting the atomic layer deposition process to prevent diffusion of the metal precursor or the silicon precursor into an underlying layer.

10. The method of claim 1, wherein the metal silicon nitride material comprises tantalum silicon nitride or titanium silicon nitride.

11. The method of claim 10, wherein the metal precursor comprises a tantalum precursor selected from the group consisting of pentakis(dimethylamido) tantalum, pentakis(ethylmethylamido) tantalum, pentakis(diethylamido) tantalum, t-butylimino-tris(diethylamido) tantalum, t-butylimino tris (ethylmethylamido) tantalum, t-butylimino-tris(dimethylamido) tantalum, bis(cyclopentadienyl) tantalum trihydride, bis(methylcyclopentadienyl) tantalum trihydride, and derivatives thereof.

12. The method of claim 10, wherein the metal precursor comprises a titanium precursor selected from the group consisting of tetrakis(dimethylamido) titanium, tetrakis(ethylmethylamido) titanium, tetrakis(diethylamido) titanium, titanium tetrachloride, titanium iodide, titanium bromide, and derivatives thereof.

13. The method of claim 10, wherein the silicon precursor comprises a compound selected from the group consisting of silane, disilane, methylsilane, dimethylsilane, chlorosilane, dichlorosilane, trichlorosilane, plasmas thereof, and derivatives thereof.

14. The method of claim 10, wherein the nitrogen precursor comprises a compound selected from the group consisting of ammonia, hydrazine, methylhydrazine, dimethylhydrazine, t-butylhydrazine, phenylhydrazine, 2,2'-azotertbutane, ethylazide, plasmas thereof, and derivatives thereof.

15. A method for depositing a tantalum silicon nitride layer on a substrate, comprising:
    positioning a substrate within a process chamber comprising a centralized expanding channel that conically tapers towards and substantially covers the substrate;
    flowing a process gas into the centralized expanding channel to form a circular flow pattern;
    exposing the substrate to the process gas having the circular flow pattern; and
    exposing the substrate sequentially to chemical precursors during at least one cycle of an atomic layer deposition process to form a tantalum silicon nitride material thereon, comprising:

pulsing a tantalum precursor into the process gas having the circular flow pattern;
pulsing a nitrogen precursor into the process gas having the circular flow pattern; and
pulsing a silicon precursor into the process gas having the circular flow pattern.

16. The method of claim 15, wherein the process gas having the circular flow pattern is exposed a center portion of the substrate and flows towards an outer edge of the substrate.

17. The method of claim 16, wherein the process gas comprises a gas selected from the group consisting of argon, nitrogen, hydrogen, helium, and combinations thereof.

18. The method of claim 16, further comprising exposing the substrate or the process gas to a plasma generated from one or more gases selected from the group consisting of hydrogen, helium, nitrogen, argon, and combinations thereof.

19. The method of claim 18, wherein the substrate is exposed to the plasma after depositing the tantalum silicon nitride material on the substrate.

20. The method of claim 18, wherein the process gas is exposed to the plasma during the pulsing of the tantalum precursor, the nitrogen precursor, the silicon precursor, or combinations thereof.

21. The method of claim 15, wherein the nitrogen precursor is a reactive compound formed by a plasma source.

22. The method of claim 21, wherein the plasma source is a remote plasma source.

23. The method of claim 15, wherein the substrate is exposed to the nitrogen precursor prior to starting the atomic layer deposition process to prevent diffusion of the tantalum precursor or the silicon precursor into an underlying layer.

24. The method of claim 15, wherein the tantalum precursor comprises a compound selected from the group consisting of pentakis(dimethylamido) tantalum, pentakis(ethylmethylamido) tantalum, pentakis(diethylamido) tantalum, t-butylimino-tris(diethylamido) tantalum, t-butylimino tris(ethylmethylamido) tantalum, t-butylimino-tris(dimethylamido) tantalum, bis(cyclopentadienyl) tantalum trihydride, bis(methylcyclopentadienyl) tantalum trihydride, and derivatives thereof.

25. The method of claim 15, wherein the silicon precursor comprises a compound selected from the group consisting of silane, disilane, methylsilane, dimethylsilane, chlorosilane, dichlorosilane, trichlorosilane, plasmas thereof, and derivatives thereof.

26. The method of claim 15, wherein the nitrogen precursor comprises a compound selected from the group consisting of ammonia, hydrazine, methylhydrazine, dimethylhydrazine, t-butylhydrazine, phenylhydrazine, 2,2'-azotertbutane, ethylazide, plasmas thereof, and derivatives thereof.

27. A method for depositing a titanium silicon nitride layer on a substrate, comprising:
positioning a substrate within a process chamber comprising a centralized expanding channel that conically tapers towards and substantially covers the substrate;
flowing a process gas into the centralized expanding channel to form a circular flow pattern;
exposing the substrate to the process gas having the circular flow pattern; and
exposing the substrate sequentially to chemical precursors during at least one cycle of an atomic layer deposition process to form a titanium silicon nitride material thereon, comprising:
pulsing a titanium precursor into the process gas having the circular flow pattern;
pulsing a nitrogen precursor into the process gas having the circular flow pattern; and
pulsing a silicon precursor into the process gas having the circular flow pattern.

28. The method of claim 27, wherein the process gas having the circular flow pattern is exposed a center portion of the substrate and flows towards an outer edge of the substrate.

29. The method of claim 28, wherein the process gas comprises a gas selected from the group consisting of argon, nitrogen, hydrogen, helium, and combinations thereof.

30. The method of claim 28, further comprising exposing the substrate or the process gas to a plasma generated from one or more gases selected from the group consisting of hydrogen, helium, nitrogen, argon, and combinations thereof.

31. The method of claim 30, wherein the substrate is exposed to the plasma after depositing the titanium silicon nitride material on the substrate.

32. The method of claim 30, wherein the process gas is exposed to the plasma during the pulsing of the titanium precursor, the nitrogen precursor, the silicon precursor, or combinations thereof.

33. The method of claim 27, wherein the nitrogen precursor is a reactive compound formed by a plasma source.

34. The method of claim 33, wherein the plasma source is a remote plasma source.

35. The method of claim 27, wherein the substrate is exposed to the nitrogen precursor prior to starting the atomic layer deposition process to prevent diffusion of the titanium precursor or the silicon precursor into an underlying layer.

36. The method of claim 27, wherein the titanium precursor comprises a compound selected from the group consisting of tetrakis(dimethylamido) titanium, tetrakis(ethylmethylamido) titanium, tetrakis(diethylamido) titanium, titanium tetrachloride, titanium iodide, titanium bromide, and derivatives thereof.

37. The method of claim 27, wherein the silicon precursor comprises a compound selected from the group consisting of silane, disilane, methylsilane, dimethylsilane, chlorosilane, dichlorosilane, trichlorosilane, plasmas thereof, and derivatives thereof.

38. The method of claim 27, wherein the nitrogen precursor comprises a compound selected from the group consisting of ammonia, hydrazine, methylhydrazine, dimethylhydrazine, t-butylhydrazine, phenylhydrazine, 2,2'-azotertbutane, ethylazide, plasmas thereof, and derivatives thereof.

39. A method for depositing a metal silicon nitride layer on a substrate, comprising:
positioning a substrate within a process chamber comprising a centralized expanding channel that conically tapers towards and substantially covers the substrate;
flowing a process gas into the centralized expanding channel to form a circular flow pattern;
exposing the substrate to the process gas having the circular flow pattern forming a plasma by igniting the process gas; and
exposing the substrate sequentially to chemical precursors during at least one cycle of an atomic layer deposition process to form a metal silicon nitride material thereon, comprising:
pulsing a metal precursor into the process gas having the circular flow pattern;
pulsing a nitrogen precursor into the process gas having the circular flow pattern; and
pulsing a silicon precursor into the process gas having the circular flow pattern.

40. A method for depositing a metal silicon nitride layer on a substrate, comprising:

positioning a substrate within a process chamber comprising a centralized expanding channel that conically tapers towards and substantially covers the substrate;

flowing a process gas into the centralized expanding channel to form a circular flow pattern;

forming a plasma by igniting the process gas;

exposing a center portion of the substrate to the process gas having the circular flow pattern and flowing the process gas across the substrate and towards an outer edge of the substrate;

exposing the substrate sequentially to chemical precursors during at least one cycle of an atomic layer deposition process to form a metal nitride material thereon, comprising:

pulsing a metal precursor into the process gas having the circular flow pattern; and pulsing a nitrogen precursor into the process gas having the circular flow pattern; and exposing the metal nitride material to a silicon precursor to form a metal silicon nitride material.

41. The method of claim 40, further comprising exposing the metal nitride material to a plasma treatment process.

* * * * *